US011300929B2

(12) United States Patent
Tombez

(10) Patent No.: US 11,300,929 B2
(45) Date of Patent: Apr. 12, 2022

(54) TIMEPIECE COMPRISING A MECHANICAL MOVEMENT WHICH RUNNING IS ENHANCED BY A REGULATION DEVICE

(71) Applicant: The Swatch Group Research and Development Ltd, Marin (CH)

(72) Inventor: Lionel Tombez, Bevaix (CH)

(73) Assignee: The Swatch Group Research and Development Ltd, Marin (CH)

( * ) Notice: Subject to any disclaimer, the term of this patent is extended or adjusted under 35 U.S.C. 154(b) by 119 days.

(21) Appl. No.: 16/496,822

(22) PCT Filed: Mar. 16, 2018

(86) PCT No.: PCT/EP2018/056726
§ 371 (c)(1),
(2) Date: Sep. 23, 2019

(87) PCT Pub. No.: WO2018/177779
PCT Pub. Date: Oct. 4, 2018

(65) Prior Publication Data
US 2020/0285199 A1   Sep. 10, 2020

(30) Foreign Application Priority Data

Mar. 28, 2017   (EP) .................................... 17163248
May 23, 2017   (EP) .................................... 17172489

(51) Int. Cl.
*G04C 3/04*   (2006.01)
*H03B 5/32*   (2006.01)
(Continued)

(52) U.S. Cl.
CPC ........... *G04C 3/045* (2013.01); *G04C 13/028* (2013.01); *H03B 5/32* (2013.01); *H03B 5/40* (2013.01)

(58) Field of Classification Search
CPC ........ G04C 3/045; G04C 13/028; H03B 5/32; H03B 5/40
See application file for complete search history.

(56) References Cited

U.S. PATENT DOCUMENTS

| 5,533,381 | A | 7/1996 | Seale |
| 7,016,265 | B2 * | 3/2006 | Born .................... G04C 10/00 368/163 |

(Continued)

FOREIGN PATENT DOCUMENTS

| CN | 1603981 A | 4/2005 |
| CN | 101089752 A | 12/2007 |

(Continued)

OTHER PUBLICATIONS

Notice of the Reason for Refusal dated Sep. 29, 2020 in Japanese Patent Application No. 2019-553304 (with English language translation), 10 pages.

(Continued)

*Primary Examiner* — Dinh T Le
(74) *Attorney, Agent, or Firm* — Oblon, McClelland, Maier & Neustadt, L.L.P.

(57) ABSTRACT

A timepiece with a mechanical movement which includes an indicator mechanism of at least one time data item, a mechanical resonator forming a mechanical oscillator which paces the running of the indicator mechanism, and a regulation device to prevent a potential time drift in the running of the indicator mechanism. The regulation device is formed by a master oscillator and a mechanical braking device of the mechanical resonator, this mechanical braking device being arranged to be able to apply periodically to the mechanical resonator braking pulses at a braking frequency determined by the master oscillator. The system, formed of the mechanical resonator and the mechanical braking device, is configured so as to enable the mechanical braking device to be able (Continued)

to start the braking pulses at any position of the mechanical resonator. The braking pulses have a duration less than one quarter of a set-point period.

20 Claims, 15 Drawing Sheets

(51) Int. Cl.
*G04C 13/02* (2006.01)
*H03B 5/40* (2006.01)

(56) References Cited

U.S. PATENT DOCUMENTS

| | | | |
|---|---|---|---|
| 9,188,957 | B2 | 11/2015 | Willemin et al. |
| 9,971,309 | B2 * | 5/2018 | Winkler ................. G04B 17/28 |
| 10,386,791 | B2 * | 8/2019 | Tombez ............... G04C 11/084 |
| 2015/0234352 | A1 | 8/2015 | Hessler et al. |
| 2017/0045861 | A1 | 2/2017 | Winkler et al. |

FOREIGN PATENT DOCUMENTS

| | | |
|---|---|---|
| CN | 104730898 A | 6/2015 |
| EP | 1 164 441 A1 | 12/2001 |
| EP | 1 241 538 A1 | 9/2002 |
| EP | 2 908 187 A1 | 8/2015 |
| FR | 833.085 | 10/1938 |
| FR | 2.162.404 | 7/1973 |
| GB | 1 378 826 | 12/1974 |
| JP | 6-338652 A | 12/1994 |
| JP | 2017-37065 A | 2/2017 |
| WO | WO 01/48565 A1 | 7/2001 |
| WO | WO 2015/140332 A2 | 9/2015 |

OTHER PUBLICATIONS

International Search Report dated Jul. 4, 2018 in PCT/EP2018/056726 filed Mar. 16, 2018.
Combined Chinese Office Action and Search Report dated Jul. 5, 2021 in Chinese Patent Application No. 201880022320.3 (with English translation of Category of Cited Documents), 7 pages.

* cited by examiner

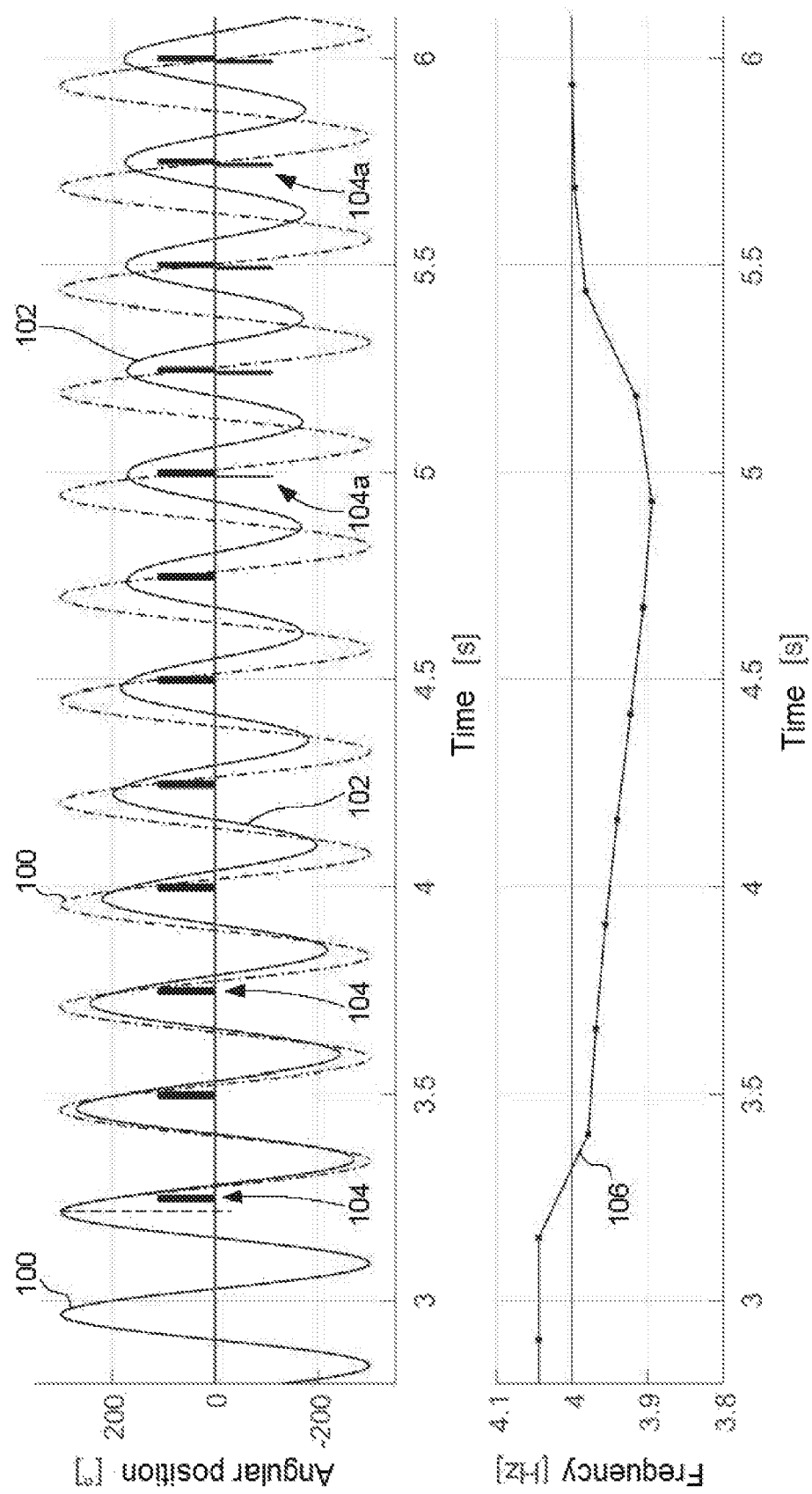

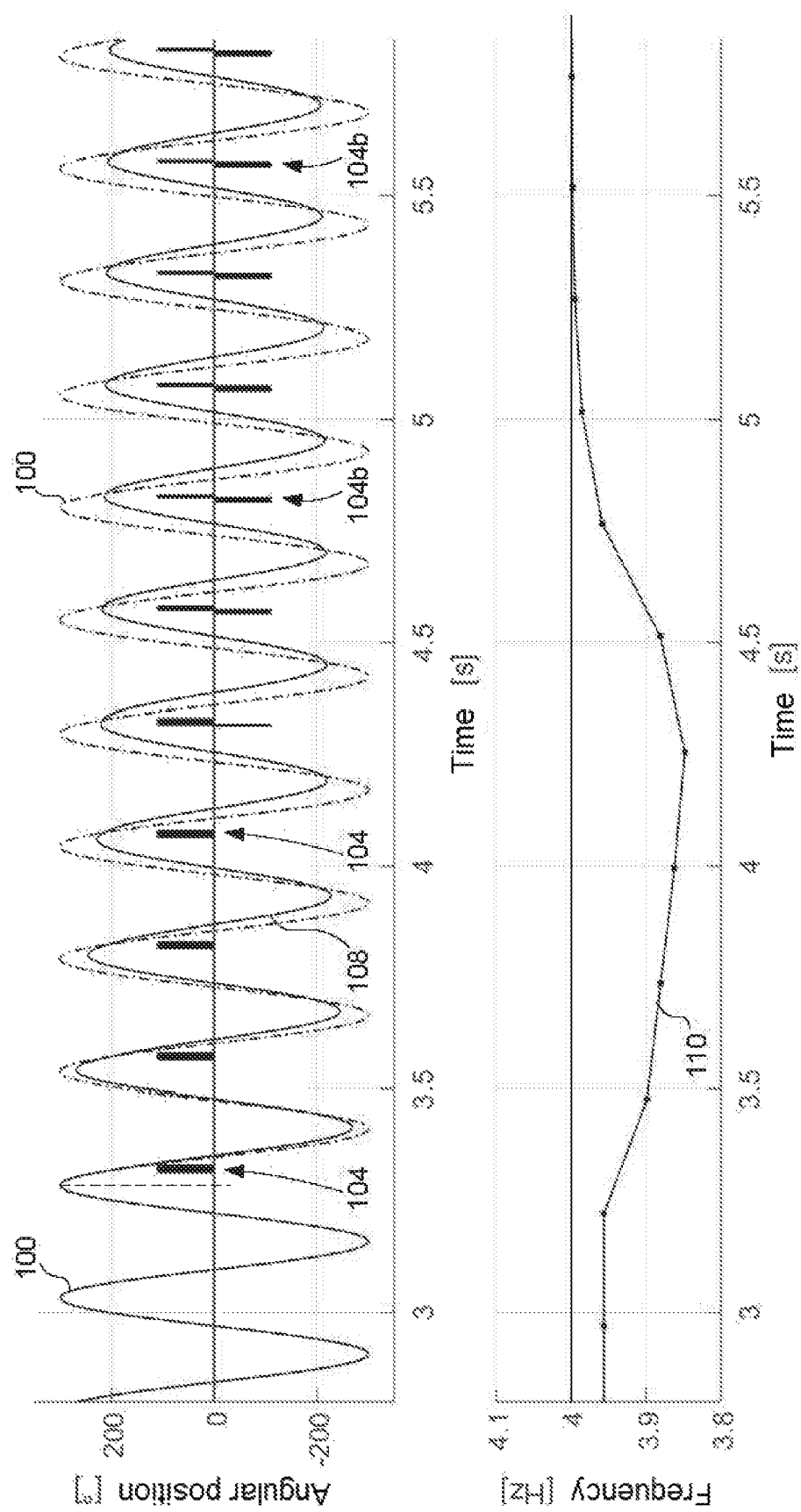

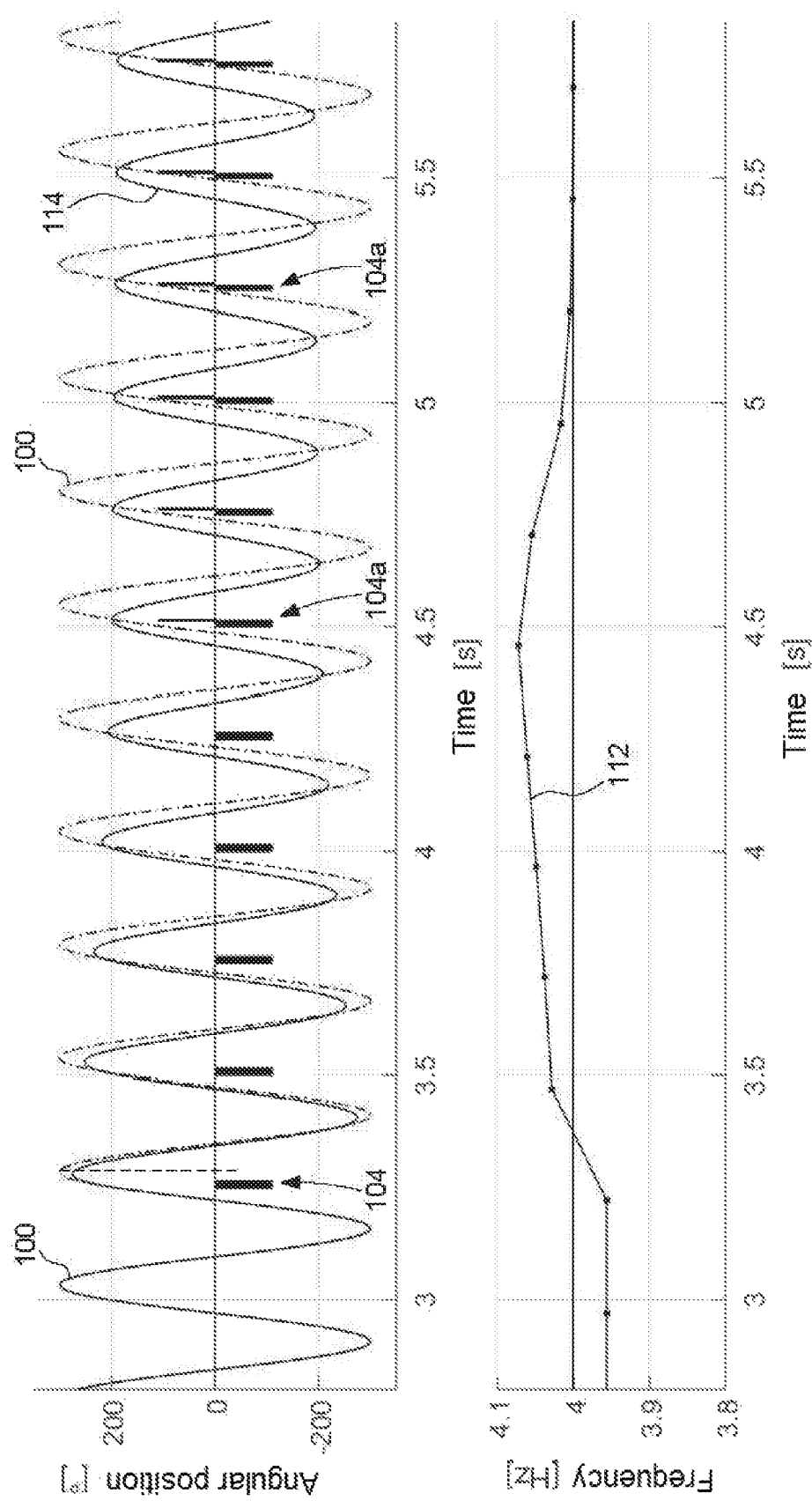

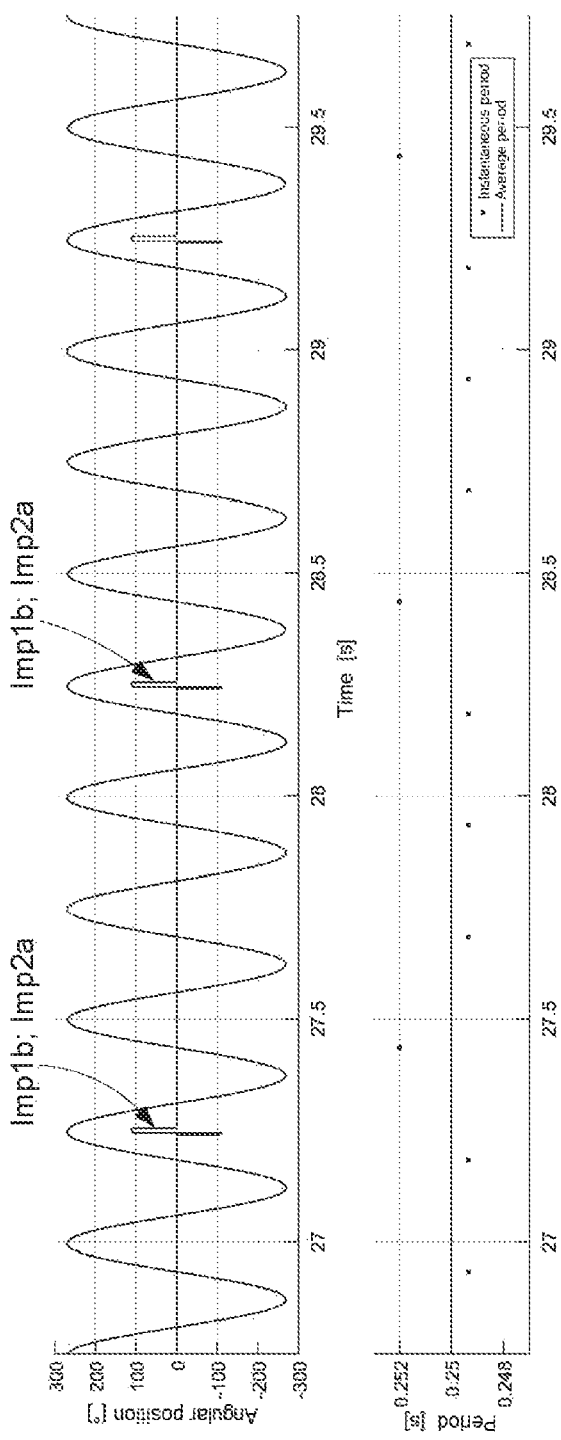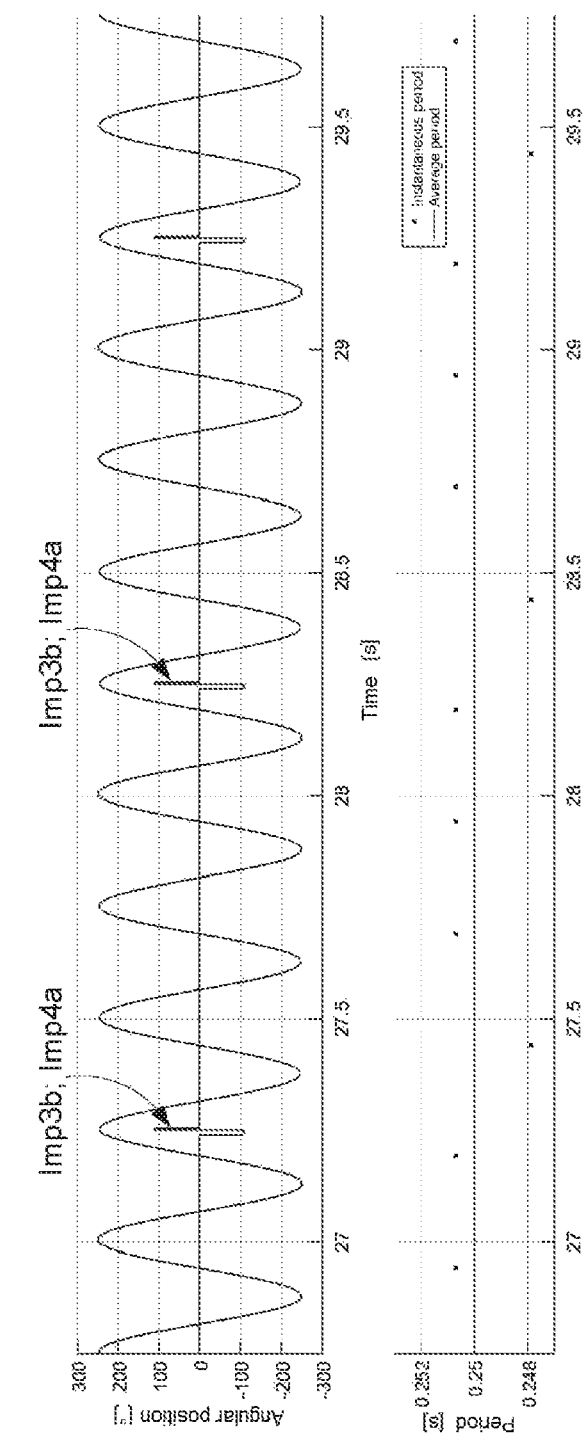
Fig. 16
Fig. 17

TIMEPIECE COMPRISING A MECHANICAL MOVEMENT WHICH RUNNING IS ENHANCED BY A REGULATION DEVICE

CROSS-REFERENCE TO RELATED APPLICATIONS

This application is a United States national stage application of International Application No. PCT/EP2018/056726 filed Mar. 16, 2018, which designates the United States, and claims priority to European Patent Application No. 17163248.2, filed Mar. 28, 2017, and European Patent Application No. 17172489.1, filed May 23, 2017, and the entire contents of each of the above applications are hereby incorporated herein by reference in entirety.

TECHNICAL FIELD

The present invention relates to a timepiece comprising a mechanical movement wherein the running is enhanced by a device for correcting a potential time drift in the operation of the mechanical oscillator which paces the running of the mechanical movement. Such a time drift occurs particularly when the average natural oscillation period of the mechanical oscillator is not equal to a set-point period. This set-point period is determined by an auxiliary oscillator which is associated with the correction device.

In particular, the timepiece is formed, on one hand, by a mechanical movement comprising:
- an indicator mechanism of at least one time data item,
- a mechanical resonator suitable for oscillating along a general oscillation axis about a neutral position corresponding to the minimum potential energy state thereof,
- a maintenance device of the mechanical resonator forming therewith a mechanical oscillator which is arranged to pace the running of the indicator mechanism, each oscillation of this mechanical oscillator defining an oscillation period, and, on the other hand, by a device for regulating the medium frequency of the mechanical oscillator to enhance the operation of the timepiece.

Technological Background

Timepieces as defined in the field of the invention have been proposed in some prior documents. The patent CH 597 636, published in 1977, proposes such a timepiece with reference to FIG. 3 thereof. The movement is equipped with a resonator formed by a balance-hairspring and a conventional maintenance device comprising a pallet assembly and an escapement wheel kinematically linked with a barrel equipped with a spring. This timepiece movement further comprises a device for regulating the frequency of the mechanical oscillator thereof. This regulation device comprises an electronic circuit and a magnetic assembly formed from a flat coil, arranged on a support arranged under the felloe of the balance, and from two magnets mounted on the balance and arranged close to one another so as to both pass over the coil when the oscillator is activated.

The electronic circuit comprises a time base comprising a quartz generator and serving to generate a reference frequency signal FR, this reference frequency being compared with the frequency FG of the mechanical oscillator. The frequency FG of the oscillator is detected via the electrical signals generated in the coil by the pair of magnets. The regulation circuit is suitable for momentarily inducing a braking torque via a magnetic magnet-coil coupling and a switchable load connected to the coil.

The use of a magnet-coil type electromagnetic system for coupling the balance-hairspring with the electronic regulation circuit gives rise to various problems. Firstly, the arrangement of permanent magnets on the balance results in a magnetic flux being constantly present in the timepiece movement and in this magnetic flux varying spatially periodically. Such a magnetic flux may have a harmful action on various members of elements of the timepiece movement, particularly on elements made of magnetic material such as parts made of ferromagnetic material. This may have repercussions on the proper operation of the timepiece movement and also increase the wear of pivoted elements. It may indeed be envisaged to screen to a certain degree the magnetic system in question, but screening requires particular elements which are borne by the balance. Such screening tends to increase the size of the mechanical resonator and the weight thereof. Furthermore, it limits the aesthetic configuration possibilities for the balance-hairspring.

Those skilled in the art are also aware of mechanical timepiece movements with which a device for regulating the frequency of the balance-hairspring thereof which is of the electromechanical type is associated. More specifically, the regulation occurs via a mechanical interaction between the balance-hairspring and the regulation device, the latter being arranged to act upon the oscillating balance by a system formed of a stop arranged on the balance and an actuator equipped with a movable finger which is actuated at a braking frequency in the direction of the stop, without however touching the felloe of the balance. Such a timepiece is described in the document FR 2.162.404. According to the concept proposed in this document, it is sought to synchronise the frequency of the mechanical oscillator on that of a quartz oscillator by an interaction between the finger and the stop when the mechanical oscillator exhibits a time drift relative to a set-point frequency, the finger being envisaged to be able to either lock momentarily the balance which is then stopped in the movement thereof during a certain time interval (the stop bearing against the finger moved in the direction thereof upon the return of the balance towards the neutral position thereof), or limit the oscillation amplitude when the finger arrives against the stop while the balance rotates in the direction of one of the end angular positions thereof (defining the amplitude thereof), the finger then stopping the oscillation and the balance starting to move straight away in the opposite direction.

Such a regulation system has numerous drawbacks and it could seriously be doubted that it could form an operational system. The periodic actuation of the finger relative to the oscillation movement of the stop and also a potentially large initial phase shift, for the oscillation of the stop with respect to the periodic movement of the finger towards this stop, pose a number of problems. It should be noted that the interaction between the finger and the stop is limited to a single angular position of the balance, this angular position being defined by the angular position of the actuator relative to the axis of the balance-hairspring and the angular position of the stop on the balance when idle (defining the neutral position thereof). Indeed, the movement of the finger is envisaged to make it possible to stop the balance by a contact with the stop, but the finger is arranged not to come into contact with the felloe of the balance. Furthermore, it should be noted that the time of an interaction between the finger and the stop is also dependent on the amplitude of the oscillation of the balance-hairspring.

It should be noted that the synchronisation sought appears to be unlikely. Indeed, in particular for a balance-hairspring wherein the frequency is greater than the set-point frequency timing the to-and-fro movements of the finger and with a first interaction between the finger and the stop which retains momentarily the balance returning from one of the two end angular positions thereof (correction reducing the error), the second interaction, after numerous oscillations without the stop touching the finger during the alternating movement thereof, will certainly be a stopping of the balance by the finger with immediate inversion of the direction of oscillation thereof, in that the stop abuts against the finger while the balance rotates towards said end angular position (correction increasing the error). Thus, not only is there an uncorrected time drift for a time interval that may be long, for example several hundred oscillation periods, but some interactions between the finger and the stop increase the time drift instead of reducing it ! It should further be noted that the phase shift of the oscillation of the stop, and therefore of the balance-hairspring, during the second interaction mentioned above may be significant according to the relative angular position between the finger and the stop (balance in the neutral position thereof).

It may thus be doubted that the desired synchronisation is obtained. Furthermore, in particular if the natural frequency of the balance-hairspring is close but not equal to the set-point frequency, scenarios where the finger is locked in the movement thereof towards the balance by the stop which is situated at this time opposite the finger are foreseeable. Such parasitic interactions may damage the mechanical oscillator and/or the actuator. Furthermore, this limits practically the tangential range of the finger. Finally, the holding duration of the finger in the interaction position with the stop must be relatively short, therefore limiting a correction inducing a delay. In conclusion, the operation of the timepiece proposed in the document FR 2.162.404 appears to be highly unlikely to a person skilled in the art, and such a person is deterred from such a teaching.

SUMMARY OF THE INVENTION

An aim of the present invention is that of finding a solution to the technical problems and drawbacks mentioned above in the technological background.

Within the scope of the present invention, it is sought generally to enhance the precision of the running of a mechanical timepiece movement, i.e. reduce the daily time drift of this mechanical movement. In particular, the present invention seeks to achieve such an aim for a mechanical timepiece movement which running is initially optimally adjusted. Indeed, a general aim of the invention is that of finding a device for preventing a potential time drift of a mechanical movement, namely a device for regulating the running of such a mechanical movement to increase the precision thereof, without for all that renouncing on being able to function autonomously with the best possible precision that this mechanical movement can have by means of the specific features thereof, i.e. in the absence of the regulation device or when the latter is inactive.

To this end, the present invention relates to a timepiece as defined above in the technical field, wherein the regulation device is formed by a mechanical braking device of the mechanical resonator. The mechanical braking device is arranged to be able to apply to the mechanical resonator a mechanical braking torque during periodic braking pulses which are generated at a braking frequency selected merely as a function of a set-point frequency for the mechanical oscillator of the timepiece movement and determined by an auxiliary oscillator associated with the regulation device. The system formed of the mechanical resonator and the mechanical braking device is configured so as to enable the mechanical braking device to be able to start the periodic braking pulses at any position of the mechanical resonator in a range of positions, along a general oscillation axis of this mechanical resonator, which extends at least on a first of the two sides from the neutral position of the mechanical resonator over at least one first range of amplitudes that the mechanical oscillator is liable to have on this first side for a usable operating range of this mechanical oscillator.

In a general alternative embodiment, the system formed of the mechanical resonator and the mechanical braking device is configured such that the range of positions of the mechanical resonator, wherein the periodic braking pulses may start, also extends on the second of the two sides from the neutral position of the mechanical resonator over at least one second range of amplitudes that the mechanical oscillator is liable to have on this second side, along the general oscillation axis, for the usable operating range of this mechanical oscillator.

In a preferred alternative embodiment, each of the two parts of the range of positions of the mechanical resonator identified hereinabove, incorporating respectively the first and second ranges of amplitudes that the mechanical oscillator is liable to have on the two sides from the neutral position of the mechanical resonator thereof, exhibit a certain range whereon it is continuous or quasi-continuous.

In a general alternative embodiment, the mechanical braking device is arranged such that the periodic braking pulses each have essentially a duration less than one quarter of the set-point period corresponding to the reciprocal of the set-point frequency. In a particular alternative embodiment, the periodic braking pulses have essentially a duration between $1/400$ and $1/10$ of the set-point period. In a preferred alternative embodiment, the periodic braking pulses have a duration between $1/400$ and $1/50$ of the set-point period.

In a preferred embodiment, the auxiliary oscillator is incorporated in the regulation device included in the timepiece.

By means of the features of the invention, surprisingly, the mechanical oscillator of the timepiece movement is synchronised on the auxiliary oscillator effectively and rapidly, as will become apparent hereinafter from the detailed description of the invention. The regulation device forms a device for synchronising the mechanical oscillator (slave mechanical oscillator) on the auxiliary oscillator (master oscillator), without closed-loop servo-control and without a measurement sensor of the movement of the mechanical oscillator. The regulation device therefore functions with an open loop and makes it possible to correct both an advance and a delay in the natural running of the mechanical movement, as will be explained hereinafter. This result is absolutely remarkable. The term 'synchronisation on a master oscillator' denotes herein a servo-control (open-loop, therefore with no feedback) of the slave mechanical oscillator to the master oscillator. The operation of the regulation device is such that the braking frequency, derived from the reference frequency of the master oscillator, is forced on the slave mechanical oscillator, which paces the running of the time data item indicator mechanism. This does not consist herein of the scenario of coupled oscillators, or even of the standard case of a forced oscillator. In the present invention, the braking frequency of the mechanical braking pulses determines the medium frequency of the slave mechanical oscillator.

The term 'pace the running of a mechanism' denotes setting the pace of the movement of the moving parts of this mechanism when operating, in particular determining the rotational speeds of the wheels thereof and thus of at least one indicator of a time data item. The term 'braking frequency' denotes a given frequency at which the braking pulses are periodically applied to the slave mechanical resonator.

In a preferred embodiment, the system formed of the mechanical resonator and the mechanical braking device is configured so as to enable the mechanical braking device to start, in the usable operating range of the slave mechanical oscillator, a mechanical braking pulse substantially at any time of the natural oscillation period of this slave mechanical oscillator. In other words, one of the periodic braking pulses may start substantially at any position of the mechanical resonator along the general oscillation axis.

As a general rule, the braking pulses have a dissipative nature as a portion of the energy of the oscillator is dissipated by these braking pulses. In a main embodiment, the mechanical braking torque is applied substantially by friction, in particular by means of a mechanical braking member applying a certain pressure on a braking surface of the mechanical resonator, which exhibits a certain range (not isolated) along the oscillation axis.

In a particular embodiment, the braking pulses apply a mechanical braking torque on the mechanical resonator wherein the value is selected so as not to momentarily lock this mechanical resonator during the periodic braking pulses. In this case, preferably, the abovementioned system is arranged to enable the mechanical braking torque generated by each of the braking pulses to be applied to the mechanical resonator during a certain continuous or quasi-continuous time interval (not zero or isolated, but having a certain significant duration).

The invention also relates to a synchronisation module of a mechanical oscillator comprised by a timepiece and which paces the running of a timepiece mechanism of this timepiece, this synchronisation module being intended to be incorporated in the timepiece to synchronise the mechanical oscillator on an auxiliary oscillator incorporated in the synchronisation module. The synchronisation module comprises a mechanical braking device of a mechanical resonator forming the mechanical oscillator which is arranged to be able to apply to the mechanical resonator a mechanical braking torque during periodic braking pulses which are generated at a braking frequency selected merely as a function of a set-point frequency for the mechanical oscillator and determined by the auxiliary oscillator. The mechanical braking device is configured so as to be able to start the periodic braking pulses at any position of the mechanical resonator in a range of positions, along a general oscillation axis, which extends on the two sides from the neutral position of the mechanical resonator on respectively at least two ranges of amplitudes that the mechanical oscillator is liable to have on these two sides for a usable operating range of this mechanical oscillator.

In a particular embodiment of the synchronisation module, the mechanical braking device comprises a braking member which is arranged to be actuated at the braking frequency so as to be able to come momentarily in contact with an oscillating member of the mechanical resonator to apply said mechanical braking torque on this oscillating member during said periodic braking pulses.

In an advantageous alternative embodiment, the braking member is arranged such that the periodic braking pulses can be applied to the oscillating member, at least in most of any transitory phase liable to occur particularly after an activation of the synchronisation module, essentially by dynamic dry friction between the braking member and a braking surface of the oscillating member.

BRIEF DESCRIPTION OF THE FIGURES

The invention will be described in detail hereinafter using the appended drawings, given by way of examples that are in no way limiting, wherein:

FIGS. 9, 10 and 11 show respectively three different scenarios liable to arise in an initial phase following the interlocking of the correction device in a timepiece according to the invention.

DETAILED DESCRIPTION OF THE INVENTION

Figure 1:
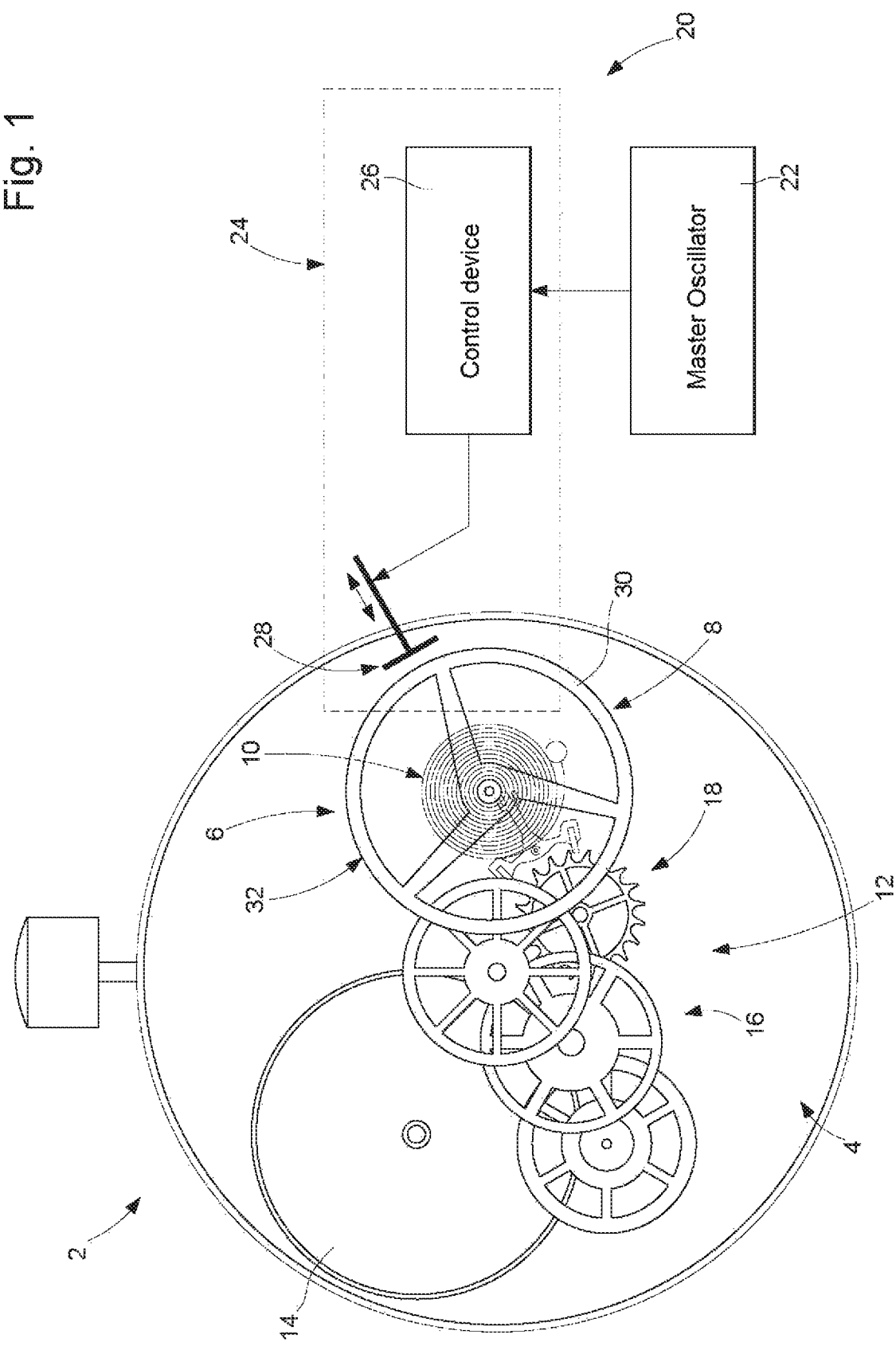
FIG. 1 shows schematically a general embodiment of a timepiece according to the invention.

In FIG. 1 is represented, in part schematically, a general embodiment of a timepiece 2 according to the present invention. It comprises a mechanical timepiece movement 4 which includes at least one indicator mechanism 12 of a time data item, this mechanism comprising a gear train 16 actuated by a barrel 14 (the mechanism is represented partially in FIG. 1). The mechanical movement further comprises a mechanical resonator 6, formed by a balance 8 and a hairspring 10, and a device for maintaining this mechanical resonator which is formed by an escapement 18, this maintenance device forming with this mechanical resonator a mechanical oscillator which paces the running of the indicator mechanism. The escapement 18 conventionally comprises a pallet assembly and an escape wheel, the latter being kinematically linked with the barrel via the gear train 16. The mechanical resonator is suitable for oscillating, about a neutral position (idle position/zero angular position) corresponding to the minimum potential energy state thereof, along a circular axis the radius whereof corresponds for example to the external radius of the felloe of the balance. As the position of the balance is given by the angular position thereof, it is understood that the radius of the circular axis is not important herein. It defines a general oscillation axis which indicates the nature of the movement of the mechanical resonator, which may be for example linear in a specific embodiment. Each oscillation of the mechanical resonator defines an oscillation period.

The timepiece 2 further comprises a device for correcting a potential time drift in the operation of the mechanical oscillator of the mechanical movement 4, this correction device 20 comprising for this purpose a mechanical braking device 24 and an auxiliary oscillator 22, hereinafter also referred to as master oscillator, which is associated with the control device 26 of the mechanical braking device to supply a reference frequency thereto. The master oscillator 22 is an auxiliary oscillator insofar as the main oscillator, which times the running of the timepiece movement directly, is the mechanical oscillator mentioned above, the latter thus being a slave oscillator. It should be noted that various types of auxiliary oscillators may be envisaged, particularly of the electronic type, such as an oscillator with a quartz resonator, or even an oscillator integrated entirely in an electronic circuit with the control circuit. Generally, the auxiliary oscillator is by nature or by design more precise than the main mechanical oscillator as arranged in the timepiece movement.

As a general rule, the mechanical braking device 24 is arranged to be able to apply periodically to the mechanical resonator 6 mechanical braking pulses at a braking frequency selected according to a set-point frequency/period and determined by the master oscillator 22. This function is represented schematically in FIG. 1 by a braking member 28 comprising a pad suitable for coming into contact with the outer lateral surface 32 of the felloe 30 of the balance. This braking member is movable (herein in translation), so as to be able to apply momentarily a braking torque on the mechanical resonator 6, and the to-and-fro movement thereof is controlled by the control device 26 which actuates periodically at the braking frequency such that the braking member comes periodically into contact with the balance in order to apply mechanical braking pulses thereto.

Then, the system, formed of the mechanical resonator 6 and the mechanical braking device 24, is configured so as to enable the mechanical braking device to be able to start the mechanical braking pulses at any position of the mechanical resonator at least in a certain continuous or quasi-continuous range of positions whereby this mechanical resonator is suitable for passing along the general oscillation axis thereof. The scenario represented in FIG. 1 corresponds to a preferred alternative embodiment wherein the system formed of the mechanical resonator and the mechanical braking device is configured so as to enable the mechanical braking device to apply a mechanical braking pulse to the mechanical resonator substantially at any time of an oscillation period within the usable operating range of the slave mechanical oscillator. Indeed, the outer lateral surface 32 of the felloe 30 is herein continuous and circular, such that the pad of the braking member 28, which moves radially, can exert a braking torque at any angular position of the balance. Thus, in particular, a braking pulse may start at any angular position of the mechanical resonator between the two end angular positions (the two amplitudes of the slave mechanical oscillator respectively of both sides from the neutral point of the mechanical resonator thereof) which can be attained when the slave mechanical oscillator is operational.

Finally, the periodic mechanical braking pulses each have essentially a duration less than one quarter of the set-point period defined for the oscillation of the slave mechanical oscillator formed by the mechanical resonator 6 and the maintenance device 12.

In an advantageous embodiment, the various elements of the correction device 20 form an independent module of the mechanical movement 4. Thus, this synchronisation module may be assembled or associated with the mechanical movement during the mounting thereof in a watch case in a final assembly step taking place before casing. In particular, such a module may be attached to a casing ring surrounding the timepiece movement. It is understood that the synchronisation module may therefore be advantageously associated with the timepiece movement once the latter is entirely assembled and adjusted, the assembly and disassembly of this module being possible without having to work on the mechanical movement per se.

Before describing in detail the remarkable operation of such a timepiece and how the synchronisation of the main mechanical oscillator on the master auxiliary oscillator is obtained, with the aid of FIGS. 2 to 5, some particular embodiments with an auxiliary oscillator of the electrical/ electronic type and a mechanical braking device of the electromechanical type will be described.

Figure 2:
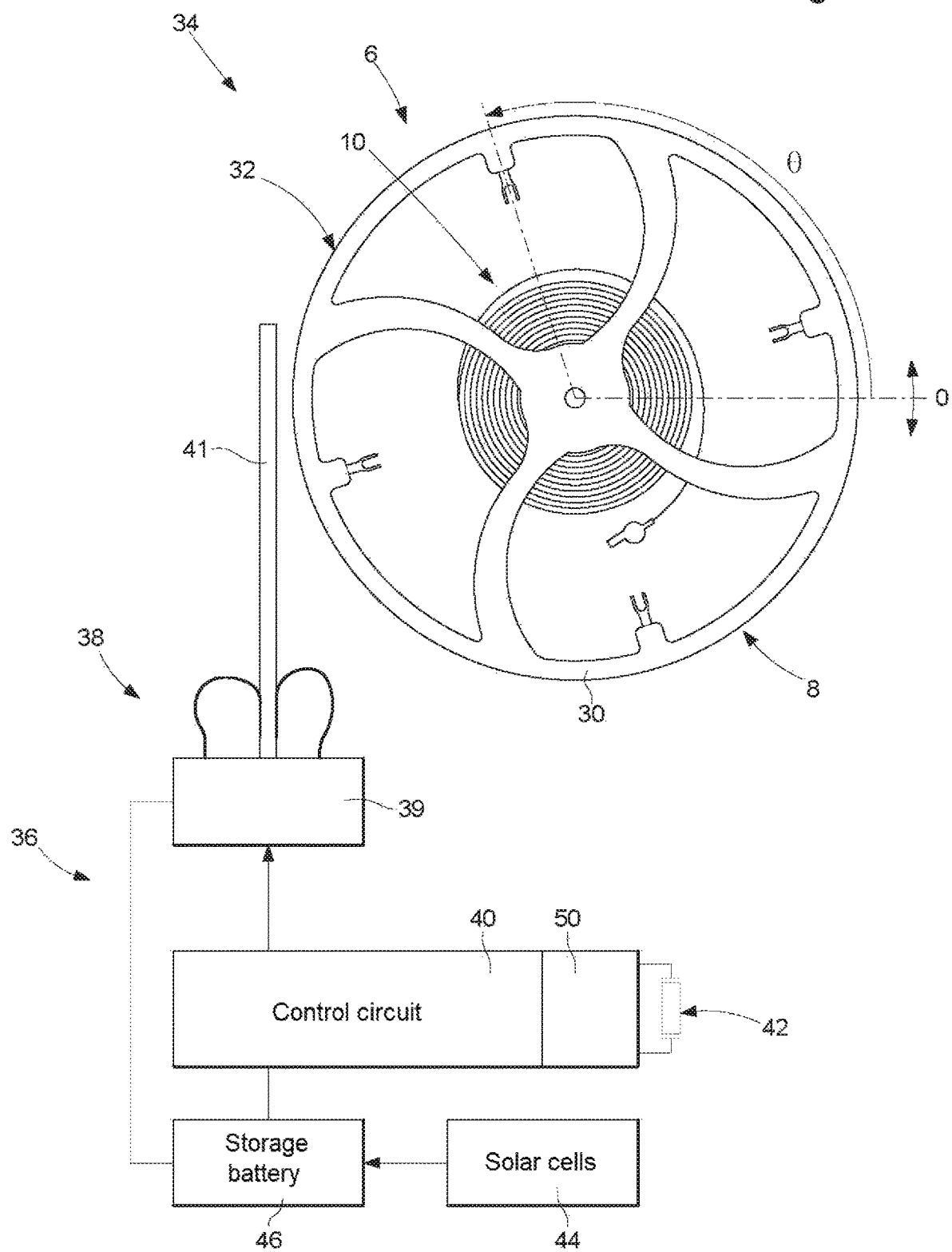
FIG. 2 shows a first particular embodiment of a timepiece according to the invention.

According to a first particular embodiment represented in FIG. 2, the timepiece 34 comprises a mechanical timepiece movement (only the resonator 6 being represented) and a device 36 for correcting a potential time drift for a mechanism for displaying at least one time data item wherein the running is paced by the mechanical oscillator formed by the resonator 6. The correction device 36 comprises an electromechanical actuator 38, and electronic circuit formed of the electronic control circuit 40 and the clock circuit 50, a quartz resonator 42, a solar cell 44 and a storage battery 46 storing the electrical energy supplied by the solar cell. The actuator 38 is formed by a power supply circuit 39 and a movable braking member 41, which is actuated in response to a control signal supplied by the electronic control circuit 40 so as to apply to the oscillating member of the mechanical resonator 6 a certain mechanical force during the mechanical braking pulses. To this end, the actuator 38 comprises a piezoelectric element which is powered by the circuit 39, an electric voltage being applied to this piezoelectric element according to the control signal. When the piezoelectric element is switched on momentarily, the braking member comes into contact with a braking surface of the balance in order to brake same.

In the example represented in FIG. 2, the strip 41 forming the braking member bends when the electric voltage is applied and the end part thereof presses against the circular lateral surface 32 of the felloe 30 of the balance 8. Thus, this felloe defines a circular braking surface. The braking member comprises a movable part, herein the end part of the strip 41, which defines a braking pad arranged so as to apply a pressure against the circular braking surface upon the application of the mechanical braking pulses. A circular braking surface, for an oscillating member which is pivoted (balance) and at least one radially movable braking pad forms within the scope of the invention a mechanical braking system which has key advantages. Indeed, in a preferred alternative embodiment, the oscillating member and the braking member are arranged such that the mechanical braking pulses are applied by dynamic dry friction between the braking member and the braking surface of the oscillating member.

It should be noted that the braking surface may be other than the outer lateral surface of the felloe of the balance. In an alternative embodiment not shown, it is the central shaft of the balance that defines a circular braking surface. In this case, a pad of the braking member is arranged so as to apply a pressure against this surface of the central shaft upon the application of the mechanical braking pulses.

By way of non-limiting examples, for a timepiece resonator formed by a balance-hairspring, wherein the constant of the hairspring k=5.75 E-7 Nm/rad and the inertia I=9.1 E-10 kg·m$^2$, and a set-point frequency $F0_C$ equal to 4 Hz, it is possible to consider a first alternative embodiment for a timepiece movement wherein the non-synchronised running is somewhat imprecise, with a daily error of about five minutes, and a second alternative embodiment for a further timepiece movement wherein the non-synchronised running is more precise with a daily error of about thirty seconds. In the first alternative embodiment, the range of values for the braking torque is between 0.2 μNm and 10 μNm, the range of values for the duration of the braking pulses is between 5 ms and 20 ms and the range of values relative to the braking period for the application of the periodic braking pulses is between 0.5 s and 3 s. In the second alternative embodiment, the range of values for the braking torque is between 0.1 μNm and 5 μNm, the range of values for the duration of the periodic braking pulses is between 1 ms and 10 ms and the range of values for the braking period is between 3 s and 60 s, i.e. at least once per minute.

Figure 3:
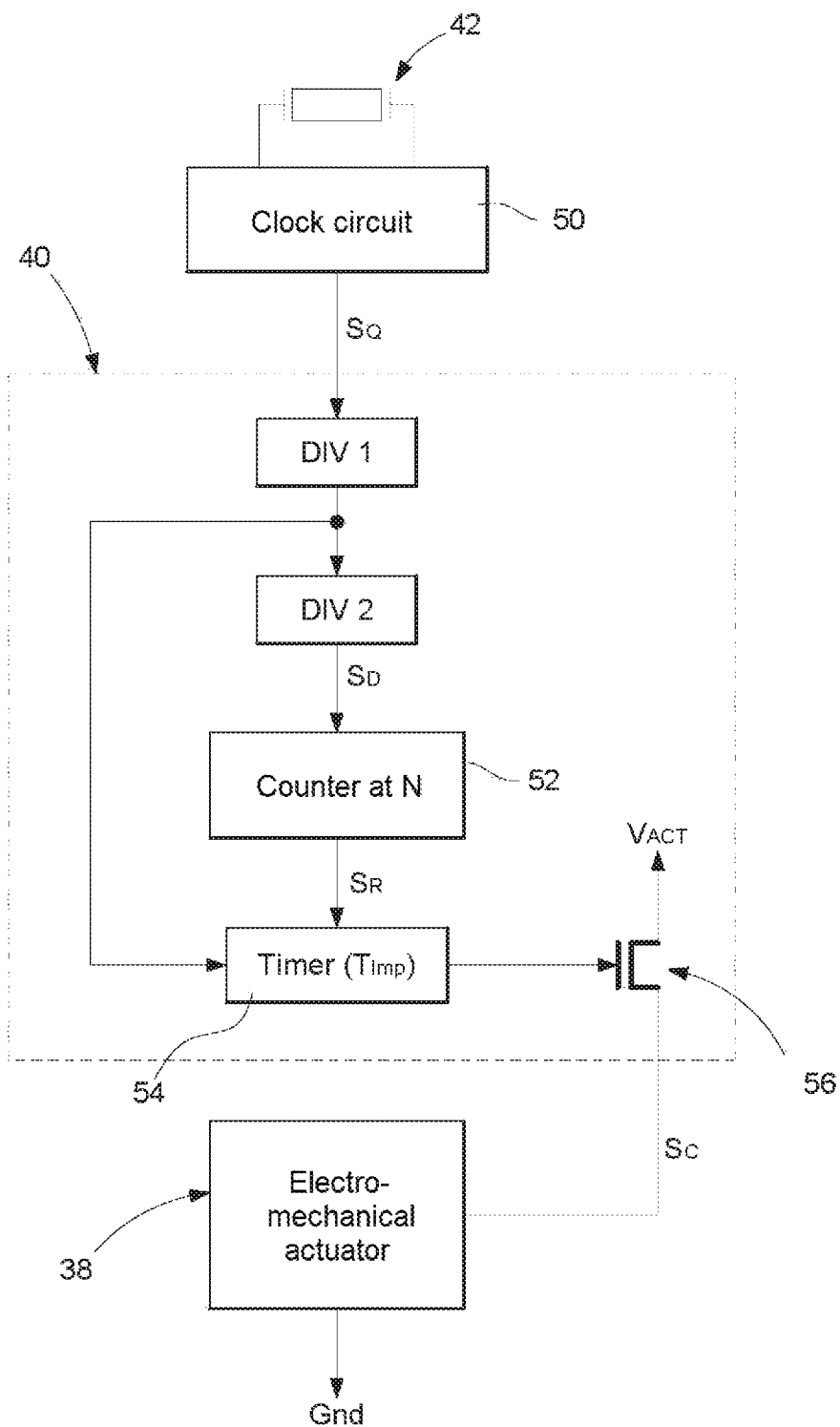
FIG. 3 shows the electronic diagram of the control circuit of the actuator of the correction device incorporated in the first particular embodiment.

FIG. 3 is a diagram showing an alternative embodiment of the control circuit 40 of the timepiece 34. This control circuit is connected on one hand to the clock circuit 50 and, on the other, to the electromechanical actuator 38. The clock circuit 50 maintains the quartz resonator 42 and generates in return a clock signal $S_Q$ at a reference frequency, particularly equal to $2^{15}$ Hz. The quartz resonator and the clock circuit form a master oscillator together. The clock signal $S_Q$ is supplied successively to two splitters DIV1 and DIV2 (these two splitters being capable of forming two stages of the same splitter). The Splitter DIV2 supplies a periodic signal $S_D$ to a counter 52. The frequency of the signal $S_D$ is for example equal to 1 Hz, 2 Hz or 4 Hz. The counter 52 is a counter at N, i.e. it counts in a loop a number N of successive pulses of the signal $S_D$ and delivers a pulse each time it reaches this number N via the signal $S_R$ that it supplies to a timer 54 (Timer). Upon each pulse received, the timer immediately opens the switch 56 to switch on and therefore power the electromechanical actuator 38 for a duration $T_{imp}$ defining the duration of each braking pulse. As this duration is essentially less than $T0_C/4$ ($T0_C$ being the set-point period of the mechanical oscillator) and preferably substantially less than this value, particularly between 1 ms and 10 ms, the timer receives a timing signal from the splitter DIV1.

In an example where the set-point frequency $F0_C$ of the mechanical oscillator is equal to 4 Hz ($F0_C$=4 Hz), the frequency of the pulses of the signal $S_D$ equal to 8 Hz and the number N equal to 16, the braking frequency $F_{FR}$ of the signal $S_R$ is then 0.5 Hz, which means that there is one braking pulse per eight periods $T0_C$, i.e. about every eight periods of the mechanical oscillator insofar as the natural frequency F0 thereof is close to the set-point frequency $F0_C$. In an alternative embodiment, the counter 52 is omitted and the splitter DIV2 delivers pulses directly to the timer to engage same periodically. In this case, preferably, the frequency of the pulses of the signal $S_D$ is equal to or less than double the set-point frequency F0. Thus, for F0=4 Hz, the frequency of the signal $S_D$ is equal to or less than 8 Hz, as there is preferably at most one braking pulse per alternation of the mechanical oscillator.

Figure 4:
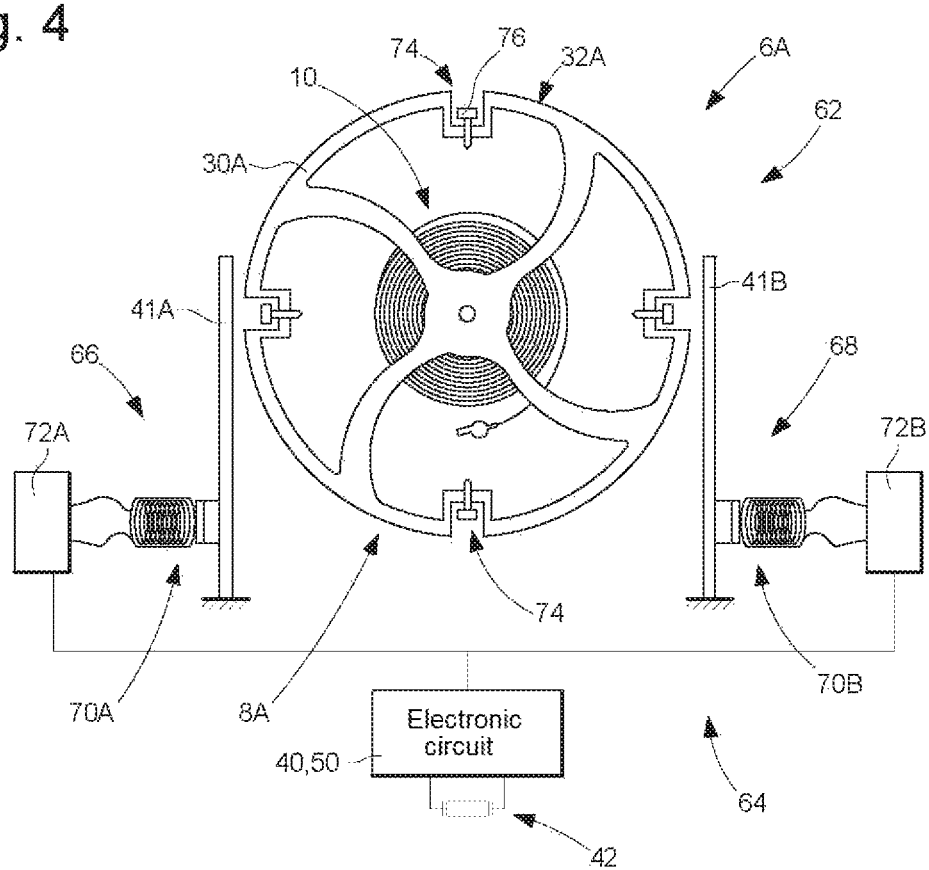
FIG. 4 shows a second particular embodiment of a timepiece according to the invention.

With reference to FIG. 4, a second particular embodiment of a timepiece 62 will be described, which differs from the preceding one firstly by the arrangement of the braking device 64 thereof. The actuator of this braking device comprises two braking modules 66 and 68 each formed by a strip 41A, respectively 41B actuated by a magnet-coil magnetic system 70A, respectively 70B. The coils of the two magnetic systems are respectively controlled by two power supply circuits 72A and 72B which are connected electrically to the electronic circuit 40, 50. The strips 41A and 41B form respectively a first braking member and a second braking member which define two pads suitable for pressing against the outer lateral surface 32A of the felloe 30A of the balance 8A. These two brake pads are arranged such that, upon the application of the periodic braking pulses, they apply to the felloe of the balance respectively two diametrically opposed radial forces relative to the axis of rotation of the balance and in opposite directions. Obviously, the force couple applied by each of the two pads during a braking pulse is substantially equal to the other. Thus, the resultant of the forces in the general plane of the balance is substantially zero such that no radial force is applied to the balance shaft during the braking pulses. This prevents mechanical stress for the pivots of this balance shaft and more generally at the bearings associated with these pivots. Such an arrangement may advantageously be incorporated in an alternative embodiment where braking is performed on the balance shaft or on a disk borne by this shaft.

Then, the resonator 6A differs from that of the preceding embodiment in that the balance 8A comprises a felloe 30A having cavities 74 (in the general plane of the balance) wherein are housed screws 76 for balancing the balance. Thus, the outer lateral surface 32A no longer defines a continuous circular surface, but a discontinuous circular surface with four continuous angular sectors. It should be noted however that the strips 41A and 41B have contact surfaces with a range such that braking pulses remain possible for any angular position of the balance, even when these two cavities are presented respectively facing the ends of two strips, as represented in FIG. 4.

In an alternative embodiment, the braking force applied to the balance is envisaged to be axial. In such an alternative embodiment, it is advantageous to envisage a mechanical braking device of the type of the second embodiment, i.e. with two braking pads arranged axially facing one another and between which the felloe of the balance particularly passes. Thus, the actuator is arranged such that, upon the application of the braking pulses, the two pads apply to the balance two substantially aligned axial forces of opposite directions. The force couple applied by each of the two pads during a braking pulse is herein also substantially equal to the other.

Figure 5:
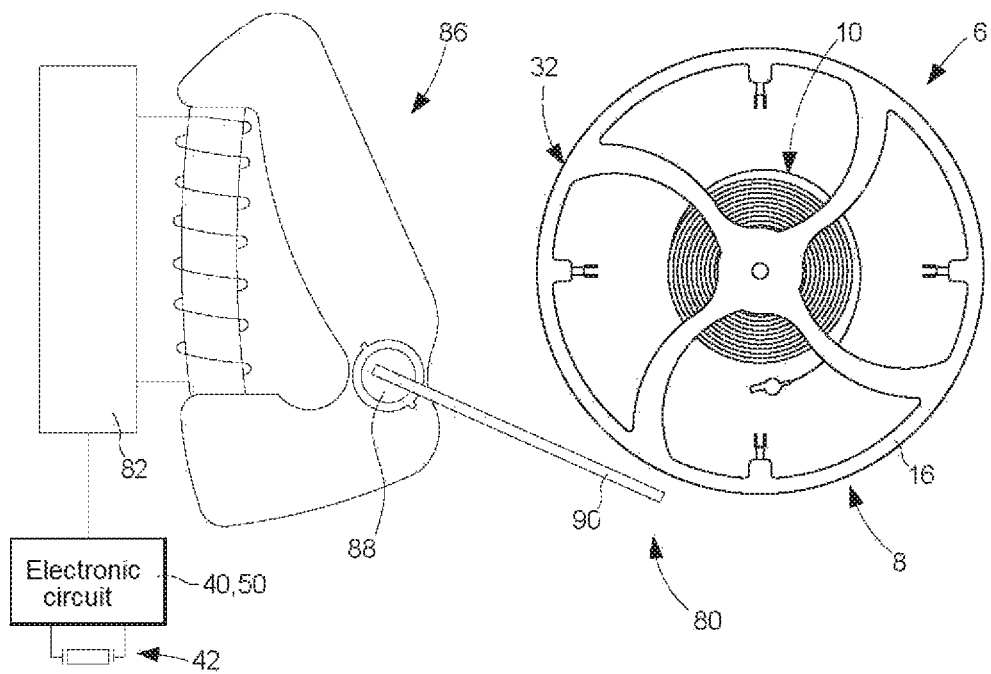
FIG. 5 shows a third particular embodiment of a timepiece according to the invention.

A timepiece 80 according to a third particular embodiment is shown in FIG. 5. It differs from the first embodiment essentially by the choice of the actuator which comprises a timepiece type motor 86 and a braking member 90 which is mounted on a rotor 88 (having a permanent magnet) of this motor so as to apply a certain force on the felloe of the balance 8 of the resonator 6 when the rotor performs a certain rotation, which is induced by a power supply 82 of a motor coil during the braking pulses in response to a control signal supplied by a control signal supplied by the control circuit 40.

According to various alternative embodiments, the electromechanical actuator comprises a piezoelectric element or a magnetorestrictive element or, to actuate said braking member, an electromagnetic system.

There will be described hereinafter, with reference to FIGS. 6 and 7, a remarkable physical phenomenon highlighted within the scope of developments resulting in the present invention and involved in the synchronisation method implemented in the timepiece according to the invention. Understanding this phenomenon will make it possible to better understand the synchronisation obtained by the correction device regulating the running of the mechanical movement, this result being described in detail hereinafter.

Figure 6:
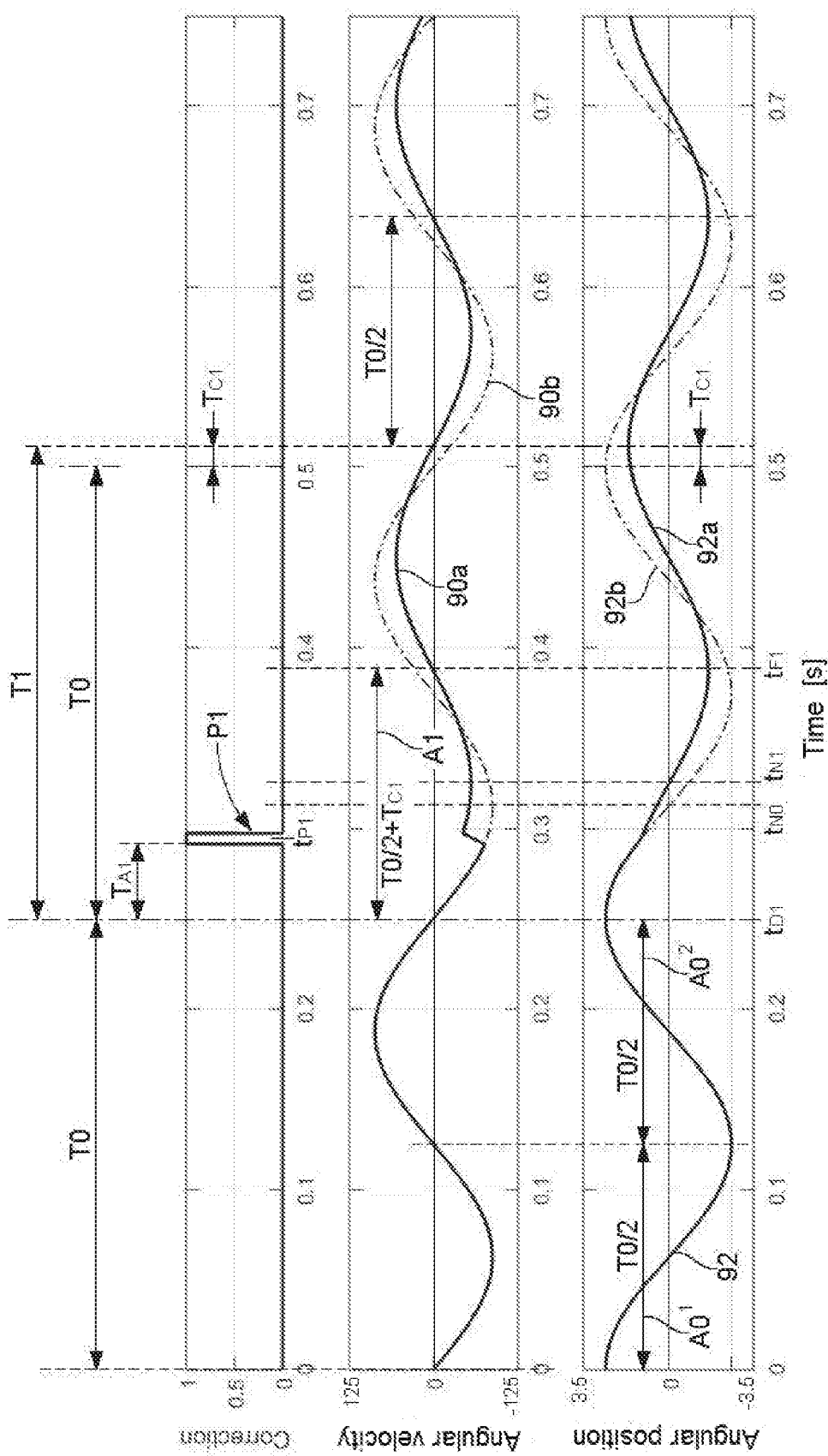
FIG. 6 shows the application of a first braking pulse to a mechanical resonator in a certain alternation of the oscillation thereof before its passes via the neutral position thereof, as well as the angular velocity of the balance and the angular position thereof in a time interval wherein the first braking pulse occurs.
Figure 7:
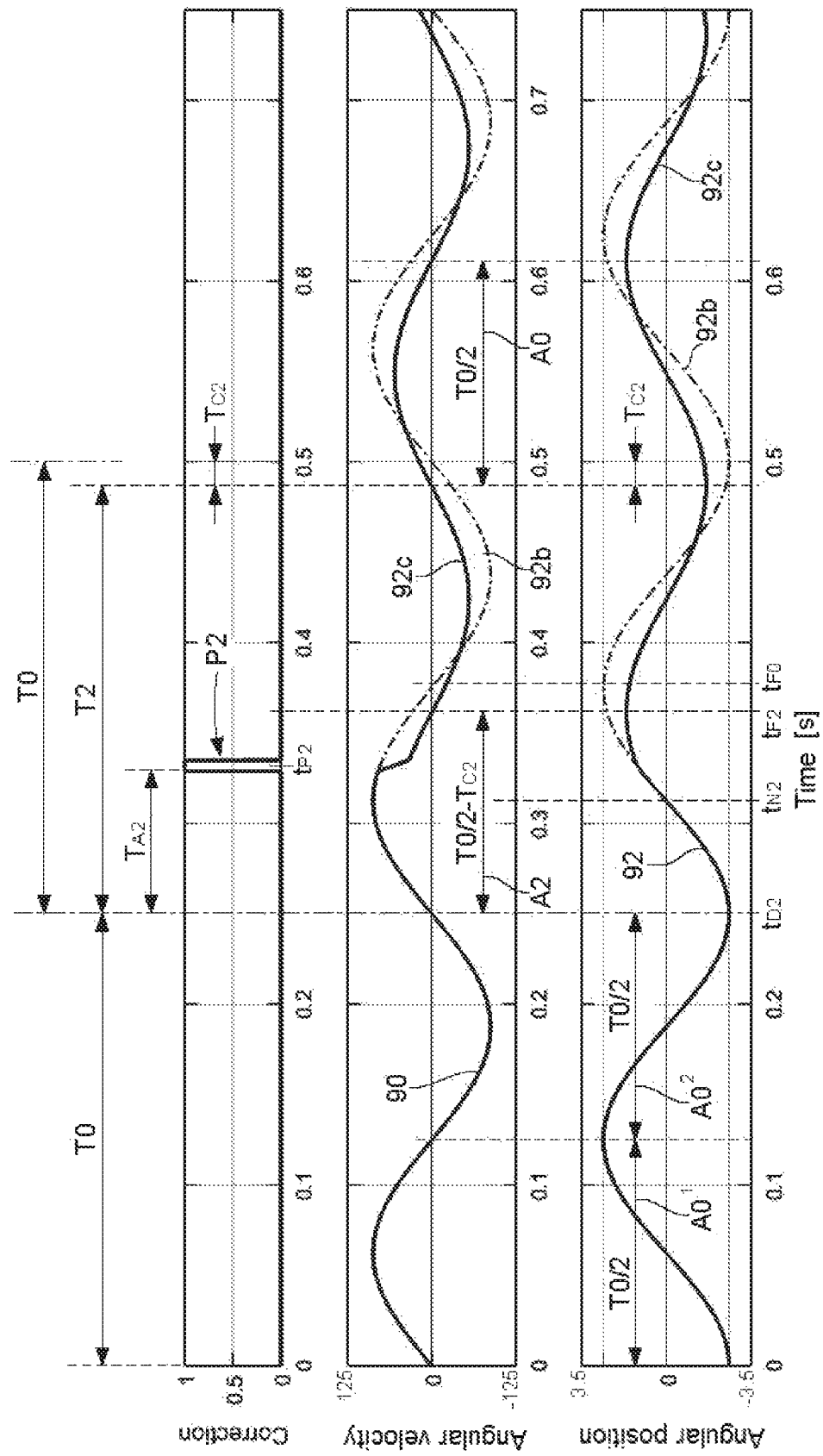
FIG. 7 is a figure similar to that in FIG. 6 but for the application of a second braking pulse in a certain alternation of the oscillation of a mechanical oscillator after it has passed via the neutral position thereof.

In FIGS. 6 and 7, the first graph shows the time $t_{P1}$ at which a braking pulse P1, respectively P2 is applied to the mechanical resonator in question to make a correction in the running of the mechanism paced by the mechanical oscillator formed by this resonator. The latter two graphs show respectively the angular velocity (values in radian per second: [rad/s]) and the angular position (values in radian: [rad]) of the oscillating member (hereinafter also 'the balance') of the mechanical resonator over time. The curves 90 and 92 correspond respectively to the angular velocity and to the angular position of the balance oscillating freely (oscillation at the natural frequency thereof) before the occurrence of a braking pulse. After the braking pulse is represented the velocity curves 90a and 90b corresponding to the behaviour of the resonator respectively in the scenario disturbed by the braking pulse and the non-disturbed scenario. Similarly, the position curves 92a and 92b correspond to the behaviour of the resonator respectively in the scenario disturbed by the braking pulse and the non-disturbed scenario. In the figures, the times $t_{P1}$ and $t_{P2}$ at which the braking pulses P1 and P2 occur correspond to the time positions of the midpoint of these pulses. However, the start of the braking pulses and the duration thereof are considered as the two parameters defining a braking pulse in terms of time.

It should be noted that the pulses P1 and P2 are represented in FIGS. 6 and 7 by binary signals. However, in the explanations hereinafter, mechanical braking pulses applied to the mechanical resonator and not control pulses are considered. Thus, it should be noted that, in certain embodiments, in particular with mechanical correction devices having a mechanical control device, the control pulse may occur at least in part before the application of a mechanical braking pulse. In such a case, in the following explanations, the braking pulses P1, P2 correspond to the mechanical braking pulses applied to the resonator and not to prior control pulses.

It should further be noted that the braking pulses may be applied with a constant force couple or a non-constant force couple (for example substantially in a Gaussian or sinusoidal curve). The term braking pulse denotes the momentary application of a force couple to the mechanical resonator which brakes the oscillating member thereof (balance), i.e. which opposes the oscillation movement of this oscillating member. In the case of couple different to zero which is variable, the duration of the pulse is defined generally as the part of this pulse which has a significant force couple to brake the mechanical resonator. It should be noted that a braking pulse may exhibit a significant variation. It may even be choppy and form a succession of shorter pulses. In the case of a constant couple, the duration of each pulse is less than a set-point half-period and preferably less than a quarter of a set-point period. It should be noted that each braking pulse may either brake the mechanical resonator without however stopping same, as in FIGS. 6 and 7, or stop it during the braking pulse and lock it momentarily during the remainder of this braking pulse.

Each free oscillation period T0 of the mechanical oscillator defines a first alternation $A0^1$ followed by a second alternation $A0^2$ each occurring between two end positions defining the oscillation amplitude of this mechanical oscillator, each alternation having an identical duration T0/2 and exhibiting a passage of the mechanical resonator via the zero position thereof at a median time. The two successive alternations of an oscillation define two half-periods during which the balance respectively sustains an oscillation movement in one direction and subsequently an oscillation movement in the other direction. In other words, an alternation corresponds to an oscillation of the balance in one direction or the other between the two end positions thereof defining the oscillation amplitude. As a general rule, a variation in the oscillation period during which the braking pulse occurs and therefore an isolated variation of the frequency of the mechanical oscillator are observed. In fact, the time variation relates to the sole alternation during which the braking pulse occurs. The term 'median time' denotes a time occurring substantially at the midpoint of the alternations. This is specifically the case when the mechanical oscillator oscillates freely. On the other hand, for the alternations during which regulation pulses occur, this median time no longer corresponds exactly to the midpoint of the duration of each of these alternations due to the disturbance of the mechanical oscillator induced by the regulation device.

The behaviour of the mechanical oscillator in a first correction scenario of the oscillation frequency thereof, which corresponds to that shown in FIG. 6, will now be described. After a first period T0 then commences a new period T2, respectively a new alternation A1 during which a braking pulse P1 occurs. At the initial time $t_{D1}$ starts the alternation A1, the resonator 14 occupying a maximum positive angular position corresponding to an end position. Then the braking pulse P1 occurs at the time $t_{P1}$ which is situated before the median time $t_{N1}$ at which the resonator passes via the neutral position thereof and therefore also before the corresponding median time $t_{N0}$ of the non-disturbed oscillation. Finally, the alternation A1 ends at the end time $t_{F1}$. The braking pulse is triggered after a time interval $T_{A1}$ following the time $t_{D1}$ marking the start of the alternation A1. The duration $T_{A1}$ is less than a half-alternation T0/4 less the duration of the braking pulse P1. In the example given, the duration of this braking pulse is considerably less than a half-alternation T0/4.

In this first case, the braking pulse is therefore generated between the start of an alternation and the passage of the resonator via the neutral position thereof in this alternation. The angular velocity in absolute values decreases during the braking pulse P1. This induces a negative time phase shift $T_{D1}$ in the oscillation of the resonator, as shown in FIG. 6 by the two curves 90a and 90b of the angular velocity and also the two curves 92a and 92b of the angular position, i.e. a delay relative to the non-disturbed theoretical signal (shown with broken lines). Thus, the duration of the alternation A1 is increased by a time interval $T_{C1}$. The oscillation period T1, comprising the alternation A1, is therefore extended relative to the value T0. This induces an isolated decrease in the frequency of the mechanical oscillator and a momentary slowing-down of the associated mechanism, the running whereof is timed by this mechanical oscillator.

With reference to FIG. 7, the behaviour of the mechanical oscillator in a second correction scenario of the oscillation frequency thereof will be described hereinafter. After a first period T0 then commences a new oscillation period T2, respectively an alternation A2 during which a braking pulse P2 occurs. At the initial time $t_{D2}$ starts the alternation A2, the mechanical resonator then being in an end position (maximum negative angular position). After a quarter-period (T0/4) corresponding to a half-alternation, the resonator reaches the neutral position thereof at the median time $t_{N2}$. Then the braking pulse P2 occurs at the time $t_{P2}$ which is situated in the alternation A2 after the median time $t_{N2}$ at which the resonator passes via the neutral position thereof. Finally, after the braking pulse P2, this alternation A2 ends at the end time $t_{F2}$ at which the resonator once again occupies an end position (maximum positive angular position in the period T2) and therefore also before the corresponding end time $t_{F0}$ of the non-disturbed oscillation. The braking pulse is triggered after a time interval $T_{A2}$ following the initial time $t_{D2}$ of the alternation A2. The duration $T_{A2}$ is greater than a half-alternation T0/4 and less than an alternation T0/2 less the duration of the braking pulse P2. In the example given, the duration of this braking pulse is considerably less than a half-alternation.

In the second scenario in question, the braking pulse is therefore generated, in an alternation, between the median time at which the resonator passes via the neutral position thereof (zero position) and the end time at which this alternation ends. The angular velocity in absolute values decreases during the braking pulse P2. Remarkably, the braking pulse induces herein a positive time phase shift $T_2$ in the oscillation of the resonator, as shown in FIG. 4 by the two curves 90b and 90c of the angular velocity and also the two curves 92b and 92c of the angular position, i.e. an advance relative to the non-disturbed theoretical signal (shown with broken lines). Thus, the duration of the alternation A2 is decreased by a time interval $T_{C2}$. The oscillation period T2, comprising the alternation A2, is therefore shorter than the value T0. This induces an isolated increase in the frequency of the mechanical oscillator and a momentary acceleration of the associated mechanism, the running whereof is paced by this mechanical oscillator. This phenomenon is surprising and not obvious, which is the reason why those skilled in the art have ignored it in the past. Indeed, obtaining an acceleration of the mechanism by a braking pulse is in principle surprising, but this is indeed the case when this running is timed by a mechanical oscillator and the braking pulse is applied to the resonator thereof.

The physical phenomenon mentioned above for mechanical oscillators is involved in the synchronisation method implemented in a timepiece according to the invention. Unlike the general teaching in the field of timepieces, it is possible not only to reduce the frequency of a mechanical oscillator with braking pulses, but it is also possible to increase the frequency of such a mechanical oscillator also with braking pulses. Those skilled in the art would expect to be able to practically only reduce the frequency of a mechanical oscillator with braking pulses and, by way of corollary, to be able to only increase the frequency of such a mechanical oscillator by applying drive pulses when supplying power to said oscillator.

Such an intuitive idea, which has become established in the field of timepieces and therefore comes first to the mind of those skilled in the art, proves to be incorrect for a mechanical oscillator. Thus, as described in detail hereinafter, it is possible to synchronise, via an auxiliary oscillator defining a master oscillator, a mechanical oscillator that is very precise moreover, whether it momentarily has a frequency that is slightly too high or too low. It is therefore possible to correct a frequency that is too high or a frequency that is too low merely by means of braking pulses. In sum, applying a braking couple during an alternation of the oscillation of a balance-hairspring induces a negative or positive phase shift in the oscillation of this balance-hairspring according to whether said braking torque is applied respectively before or after the passage of the balance-hairspring via the neutral position thereof.

Figure 8A:
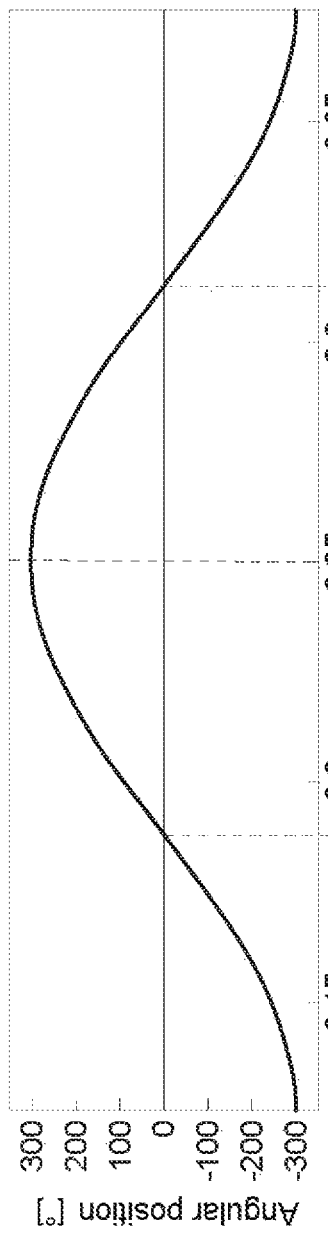
FIGS. 8A, 8B and 8C show respectively the angular position of a balance-hairspring during an oscillation period, the variation of the running of the timepiece movement obtained for a braking pulse of fixed duration, for three values of a constant braking torque, according to the angular position of the balance-hairspring, and the corresponding braking power.
Figure 8B:
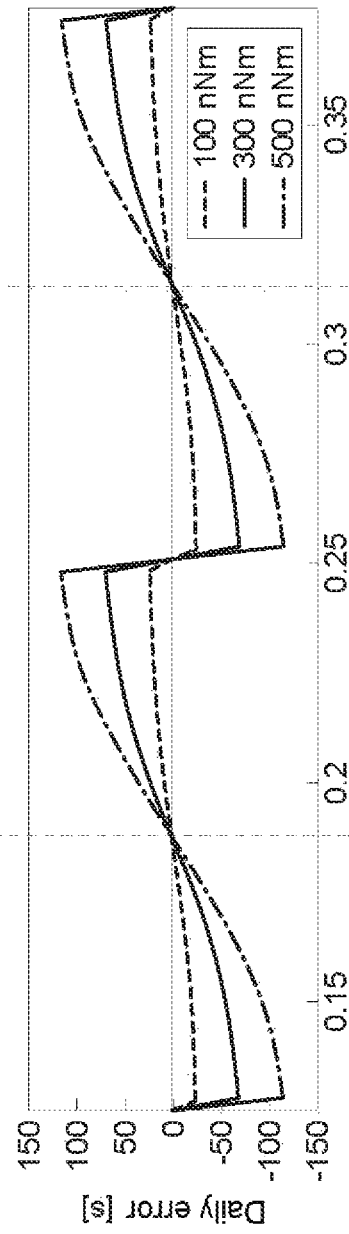
Figure 8C:
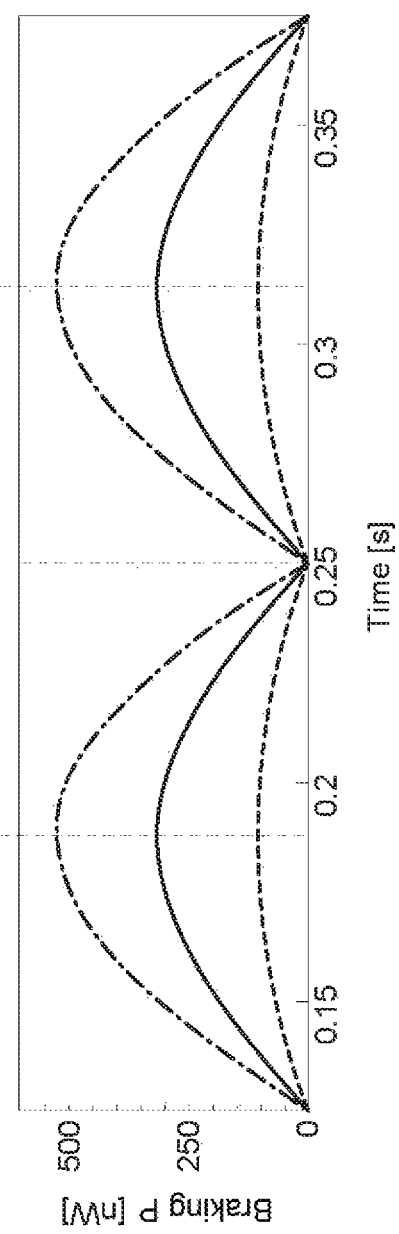

The resulting synchronisation method of the correction device incorporated in a timepiece according to the invention is described hereinafter. In FIG. 8A is shown the angular position (in degrees) of a timepiece mechanical resonator oscillating with an amplitude of 300° during an oscillation period of 250 ms. In FIG. 8B is shown the daily error generated by braking pulses of one millisecond (1 ms) applied in successive oscillation periods of the mechanical resonator according to the time of the application thereof within these periods and therefore according to the angular position of the mechanical resonator. Herein is based on the fact that the mechanical oscillator functions freely at a natural frequency of 4 Hz (non-disturbed scenario). Three curves are given respectively for three force couples (100 nNm, 300 nNm and 500 nNm) applied by each braking pulse. The result confirms the physical phenomenon described above, namely that a braking pulse occurring in the first quarter-period or the third quarter-period induces a delay stemming from a decrease in the frequency of the mechanical oscillator, whereas a braking pulse occurring in the second quarter-period or the fourth quarter-period induces an advance stemming from an increase in the frequency of the mechanical oscillator. Then, it is observed that, for a given force couple, the daily error is equal to zero for a braking pulse occurring at the neutral position of the resonator, this daily error increasing (in absolute values) on approaching an end position of the oscillation. At this end position where the velocity of the resonator passes via zero and where the direction of the movement changes, there is a sudden inversion of the sign of the daily error. Finally, in FIG. 8C is given the braking power consumed for the three force couple values mentioned above as a function of the time of application of the braking pulse during an oscillation period. As the velocity decreases on approaching the end positions of the resonator, the braking power decreases. Thus, while the daily error induced increases on approaching the end positions, the braking power required (and therefore the energy lost by the oscillator) decreases significantly.

The error induced in FIG. 8B may correspond in fact to a correction for the scenario where the mechanical oscillator has a natural frequency which does not correspond to a set-point frequency. Thus, if the oscillator has a natural frequency that is too low, braking pulses occurring in the second or fourth quarter of the oscillation period may enable a correction of the delay adopted by the free (non-disturbed) oscillation, this correction being more or less substantial according to the time of the braking pulses within the oscillation period. On the other hand, if the oscillator has a natural frequency that is too high, braking pulses occurring in the first or third quarter of the oscillation period may enable a correction of the advance adopted by the free oscillation, this correction being more or less substantial according to the time of the braking pulses within the oscillation period.

The teaching given above makes it possible to understand the remarkable phenomenon of the synchronisation of a main mechanical oscillator (slave oscillator) on an auxiliary oscillator, forming a master oscillator, by the mere periodic application of braking pulses on the slave mechanical resonator at a braking frequency $F_{FR}$ corresponding advantageously to double the set-point frequency $F0_C$ divided by a positive whole number N, i.e. $F_{FR}=2 \cdot F0_C/N$. The braking frequency is thus proportional to the set-point frequency for the master oscillator and merely dependent on this set-point frequency once the positive whole number N is given. As the set-point frequency is equal to a fractional number multiplied by the reference frequency, the braking frequency is therefore proportional to the reference frequency and determined by this reference frequency, which is supplied by the auxiliary oscillator which is by nature or by design more precise than the main mechanical oscillator.

The synchronisation mentioned above obtained by the correction device incorporated in the timepiece according to the invention will now be described in more detail with the aid of FIGS. 9 to 22.

In FIG. 9 is represented on the top graph the angular position of the slave mechanical resonator, particularly of the balance-hairspring of a timepiece resonator, oscillating freely (curve 100) and oscillating with braking (curve 102). The frequency of the free oscillation is greater than the set-point frequency $F0_C$=4 Hz. The first mechanical braking pulses 104 (hereinafter also referred to as 'pulses') occur herein once per oscillation period in a half-alternation between the passage via an end position and the passage via zero. This choice is arbitrary as the system does not detect the angular position of the mechanical resonator; this is therefore merely a possible hypothesis among others which will be analysed hereinafter. Therefore, the scenario of a slowing-down of the mechanical oscillator is observed herein. The braking torque for the first braking pulse is selected herein greater than a minimum braking torque to compensate for the advance adopted by the free oscillator over an oscillation period. This results in the second braking pulse taking place slightly before the first within the quarter-period wherein these pulses occur. The curve 106, which gives the instantaneous frequency of the mechanical oscillator, indeed indicates that the instantaneous frequency falls below the set-point frequency from the first pulse. Thus, the second braking pulse is closer to the preceding end position, such that the braking effect increases and so on with the subsequent pulses. In a transitory phase, the instantaneous frequency of the oscillator decreases therefore progressively and the pulses move closer progressively to an end position of the oscillation. After a certain time, the braking pulses comprise the passage via the end position where the velocity of the mechanical resonator changes direction and the instantaneous frequency then starts to increase.

The braking is characterised in that it opposes the movement of the resonator regardless of the direction of the movement thereof. Thus, when the resonator passes via an inversion of the direction of the oscillation thereof during a braking pulse, the braking torque automatically changes sign at the time of this inversion. This gives braking pulses 104a which have, for the braking torque, a first part with a first sign and a second part with a second sign opposite the first sign. In this scenario, the first part of the signal therefore occurs before the end position and opposes the effect of the second part which occurs after this end position. While the second part reduces the instantaneous frequency of the mechanical oscillator, the first part increases same. The correction then decreases to stabilise eventually and relatively quickly at a value for which the instantaneous frequency of the oscillator is equal to the set-point frequency (corresponding herein to the braking frequency). Thus, the transitory phase is succeeded by a stable phase, also referred to as synchronous phase, where the oscillation frequency is substantially equal to the set-point frequency and where the first and second parts of the braking pulses has a substantially constant and defined ratio.

The graphs in FIG. 10 are equivalent to those in FIG. 9. The major difference is the value of the natural frequency of the free mechanical oscillator which is less than the set-point frequency $F0_C$=4 Hz. The first pulses 104 occur in the same half-alternation as in FIG. 9. As expected, a decrease in the instantaneous frequency given by the curve 110 is observed. The oscillation with braking 108 therefore adopts momentarily more delay in the transitory phase, until the pulses 104b start to encompass the passage of the resonator via an end position. From this time, the instantaneous frequency starts to increase until it reaches the set-point frequency, as the first part of the pulses occurring before the end position increases the instantaneous frequency. This phenomenon is automatic. Indeed, while the duration of the oscillation periods is greater than the duration of the $T0_C$, the first part of the pulse increases while the second part decreases and consequently the instantaneous frequency continues to increase to a stable status where the set-point period is substantially equal to the oscillation period. Therefore, the desired synchronisation is obtained.

The graphs in FIG. 11 are equivalent to those in FIG. 10. The major difference is in that the first braking pulses 114 occur in another half-alternation than in FIG. 10, namely in a half-alternation between the passage via zero and the passage via an end position. As described above, in a transitory phase, an increase in the instantaneous frequency given by the curve 112 is observed herein. The braking torque for the first braking pulse is selected herein greater than a minimum braking torque to compensate for the delay adopted by the free mechanical oscillator over an oscillation period. This results in the second braking pulse taking place slightly after the first within the quarter-period wherein these pulses occur. The curves 112 shows indeed that the instantaneous frequency of the oscillator increases above the set-point frequency from the first pulse. Thus, the second braking pulse is closer to the subsequent end position, such that the braking effect increases and so on with the subsequent pulses. In the transitory phase, the instantaneous frequency of the oscillation with braking 114 increases therefore and the braking pulses move closer progressively to an end position of the oscillation. After a certain time, the braking pulses comprise the passage via the end position where the velocity of the mechanical resonator changes direction. From that time, a similar phenomenon to that described above is observed. The braking pulses 114a then have two parts and the second part reduces the instantaneous frequency. This decrease in the instantaneous frequency continues until it has a value equal to the set-point value for the same reasons as given with reference to FIGS. 9 and 10. The decrease in frequency stops automatically when the instantaneous frequency is substantially equal to the set-point frequency. A stabilisation of the frequency of the mechanical oscillator at the set-point frequency in a synchronous phase is then obtained.

Figure 12:
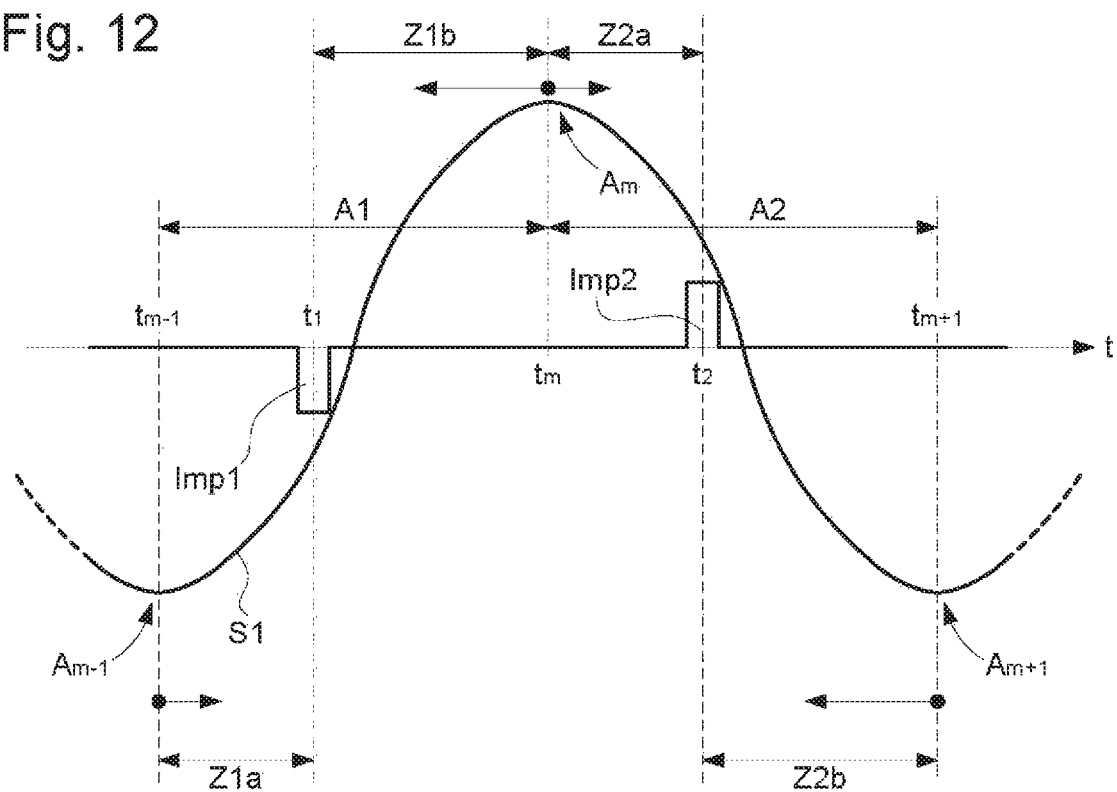
FIG. 12 is an explanatory graph of the physical process arising following the interlocking of the correction device in the timepiece according to the invention and resulting in the synchronisation sought for the scenario where the natural frequency of the slave mechanical oscillator is greater than the set-point frequency.

With the aid of FIGS. 12 to 15, the behaviour of the mechanical oscillator in the transition phase for any time where a first braking pulse occurs during an oscillation period will be described, as well as the final scenario corresponding to the synchronous phase where the oscillation frequency is stabilised on the set-point frequency. FIG. 12 represents an oscillation period with the curve S1 of the positions of a mechanical resonator. In the scenario in question herein, the natural oscillation frequency F0 of the free mechanical oscillator (with no braking pulses) is greater than the set-point frequency $F0_C$ ($F0 > F0_C$). The oscillation period comprises conventionally a first alternation A1 followed by a second alternation A2, each between two end positions ($t_{m-1}$, $A_{m-1}$; $t_m$, $A_m$; $t_{m+1}$, $A_{m+1}$) corresponding to the oscillation amplitude. Then, there is represented, in the first alternation, a braking pulse 'Imp1' wherein the midpoint time position occurs at a time $t_1$ and, in the second alternation, a further braking pulse 'Imp2' wherein the midpoint time position occurs at a time $t_2$. The pulses Imp1 and Imp2 exhibit a phase shift of T0/2, and they are characterised in that they correspond, for a given braking torque profile, to corrections inducing two unstable equilibria of the system. As these pulses occur respectively in the first and the third quarter of the oscillation period, they therefore brake the mechanical oscillator to a degree which makes it possible exactly to correct the excessively high natural frequency of the free mechanical oscillator (with the braking frequency selected for the application of the braking pulses). It should be noted that the pulses Imp1 and Imp2 are both of the first pulses, each being considered on its own in the absence of the other. It should be observed that the effects of the pulses Imp1 and Imp2 are identical.

If a first pulse occurs at the time $t_1$ or $t_2$, there will therefore be theoretically a repetition of this scenario during the next oscillation periods and an oscillation frequency equal to the set-point frequency. Two things should be noted for such a scenario. Firstly, the probability of a first pulse occurring exactly at the time $t_1$ or $t_2$ is relatively low though possible. Secondly, should such a particular scenario arise, it would not be able to last for a long time. Indeed, the instantaneous frequency of a balance-hairspring in a timepiece varies slightly over time for various reasons (oscillation amplitude, temperature, change of spatial orientation, etc.). Although these reasons represent disturbances that it is generally sought to minimise in fine watchmaking, the fact remains that, in practice, such an unstable equilibrium will not last very long. It should be noted that the higher the braking torque, the closer the times $t_1$ and $t_2$ are to the two passage times of the mechanical resonator via the neutral position thereof following same respectively. It should be noted further that the greater the difference between the natural oscillation frequency F0 and the set-point frequency $F0_C$, the closer the times $t_1$ and $t_2$ are also to the two passage times of the mechanical resonator via the neutral position thereof following same respectively.

Let us now consider what happens when deviating slightly from the time positions $t_1$ or $t_2$ during the application of the pulses. According to the teaching given with reference to FIG. 8B, if a pulse occurs to the left (prior time position) of the pulse Imp1 in the zone Z1a, the correction increases such that during subsequent periods, the preceding end position $A_{m-1}$ will progressively approach the braking pulse. On the other hand, if a pulse occurs to the right (subsequent time position) of the pulse Imp1, to the left of the zero position, the correction decreases such that during the subsequent periods the pulses drift towards this zero position where the correction becomes nil. Indeed, the effect of the pulse changes and an increase in the instantaneous frequency occurs. As the natural frequency is already too high, the pulse will rapidly drift to the end position $A_m$. Thus, if a pulse takes place to the right of the pulse Imp1 in the zone Z1b, the subsequent pulses will progressively approach the subsequent end position $A_m$. The same behaviour is observed in the second alternation A2. If a pulse takes place to the left of the pulse Imp2 in the zone Z2a, the subsequent pulses will progressively approach the preceding end position $A_m$. On the other hand, if a pulse takes place to the right of the pulse Imp2 in the zone Z2b, the subsequent pulses will progressively approach the subsequent end position $A_{m+1}$. It should be noted that this formulation is relative as in fact the application frequency of the braking pulses is set by the master oscillator (given braking frequency), such that it is the oscillation periods that vary and hence it is the end position in question that approaches the application time of a braking pulse. In conclusion, if a pulse occurs in the first alternation A1 at a time other than $t_1$, the instantaneous oscillation frequency progresses in a transitory phase during the subsequent oscillation periods such that one of the two end positions of this first alternation (positions of inversion of the direction of movement of the mechanical resonator) progressively approaches the braking pulses. The same applies for the second alternation A2.

Figure 13:
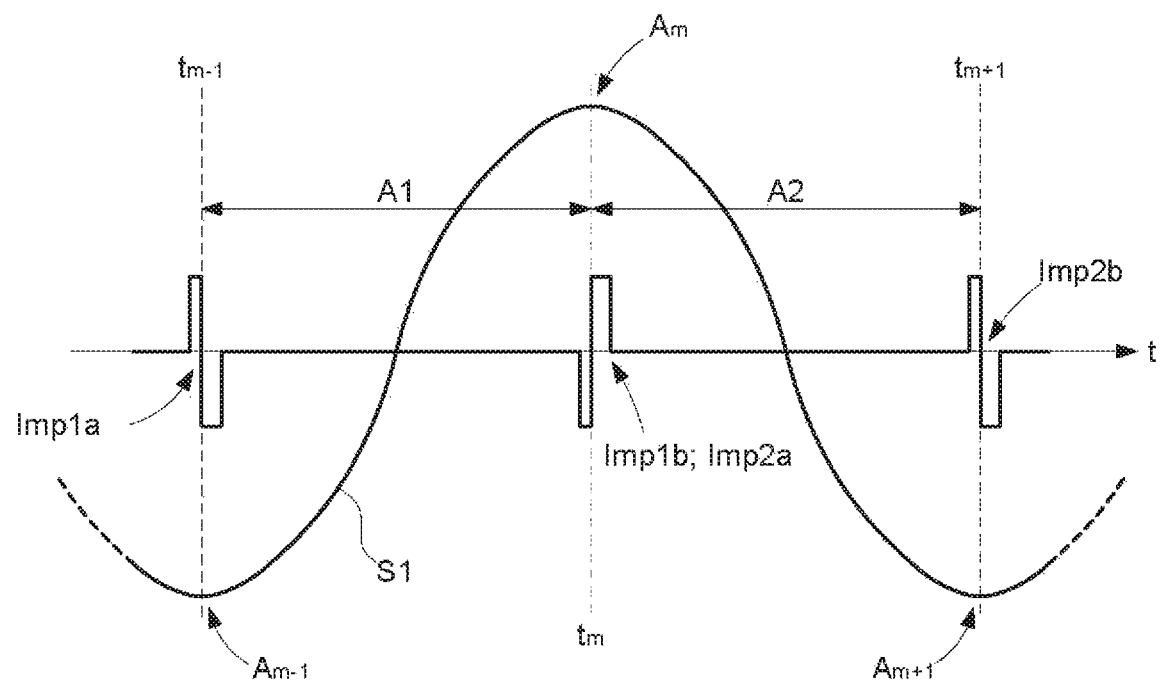
FIG. 13 represents, in the scenario of FIG. 12, an oscillation of the slave mechanical oscillator and the braking pulses in a stable synchronous phase for an alternative embodiment where a braking pulse occurs in each alternation.

FIG. 13 shows the synchronous phase corresponding to a final stable status occurring after the transitory phase described above. As previously explained, once the passage via an end position occurs during a braking pulse, this end position will be aligned on the braking pulses for all that these braking pulses are configured (the force couple and the duration) to be able to correct the time drift of the free mechanical oscillator sufficiently at least with a braking pulse occurring entirely, depending on the case, just before or just after an end position. Thus, in the synchronous phase, if a first pulse occurs in the first alternation A1, either the end position $A_{m-1}$ of the oscillation is aligned on the pulses Imp1a, or the end position $A_m$ of the oscillation is aligned on the pulses Imp1b. In the case of a substantially constant couple, the pulses Imp1*a* and Imp1*b* each have a first part wherein the duration is shorter than that of the second part thereof, so as to correct exactly the difference between the natural frequency that is too high of the slave main oscillator and the set-point frequency set by the master auxiliary oscillator. Similarly, in the synchronous phase, if a first pulse occurs in the second alternation A2, either the end position $A_m$ of the oscillation is aligned on the pulses Imp2*a*, or the end position $A_{m+1}$ of the oscillation is aligned on the pulses Imp2*b*.

It should be noted that the pulses Imp1*a*, respectively Imp1*b*, Imp2*a* and Imp2*b* occupy relatively stable time positions. Indeed, a slight deviation to the left or to the right of one of these pulses, due to an external disturbance, will have the effect of returning a subsequent pulse to the initial relative time position. Then, if the time drift of the mechanical oscillator varies during the synchronous phase, the oscillation will automatically sustain a slight phase shift such that the ratio between the first part and the second part of the pulses Imp1*a*, respectively Imp1*b*, Imp2*a* and Imp2*b* varies to a degree which adapts the correction induced by the braking pulses to the new difference in frequency. Such behaviour of the timepiece according to the present invention is truly remarkable.

Figure 14:
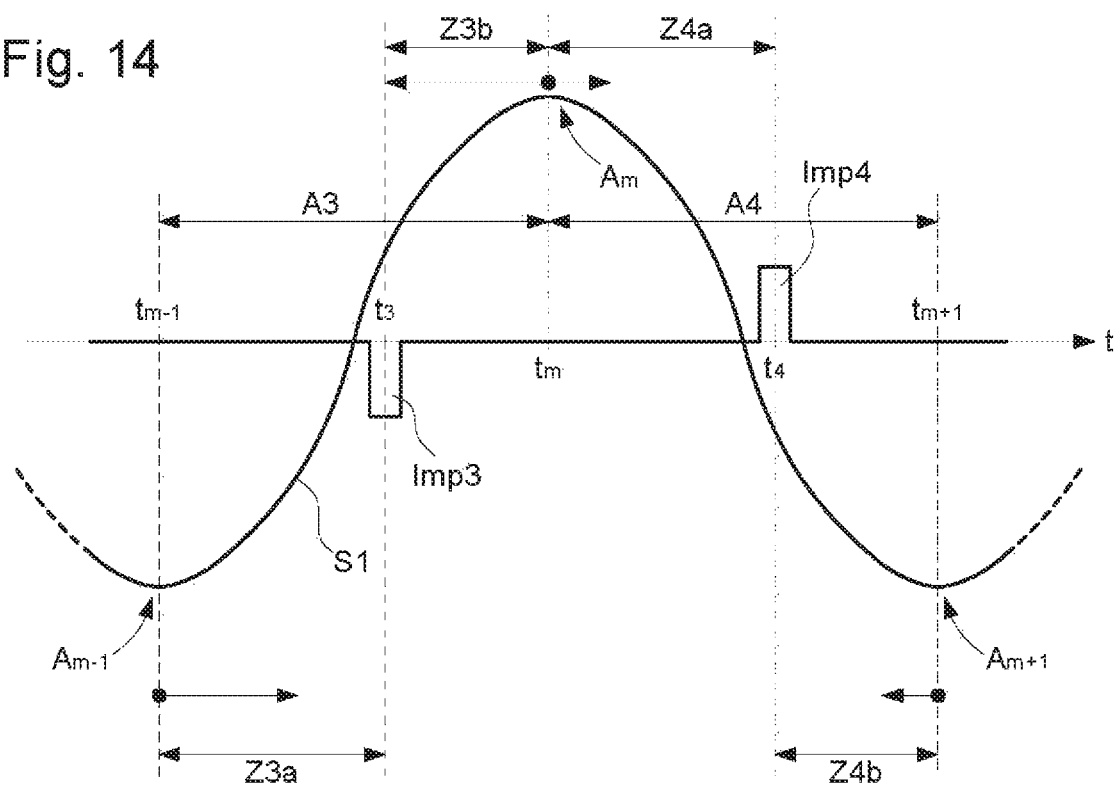
FIG. 14 is an explanatory graph of the physical process arising following the interlocking of the correction device in the timepiece according to the invention and resulting in the synchronisation sought for the scenario where the natural frequency of the slave mechanical oscillator is less than the set-point frequency.
Figure 15:
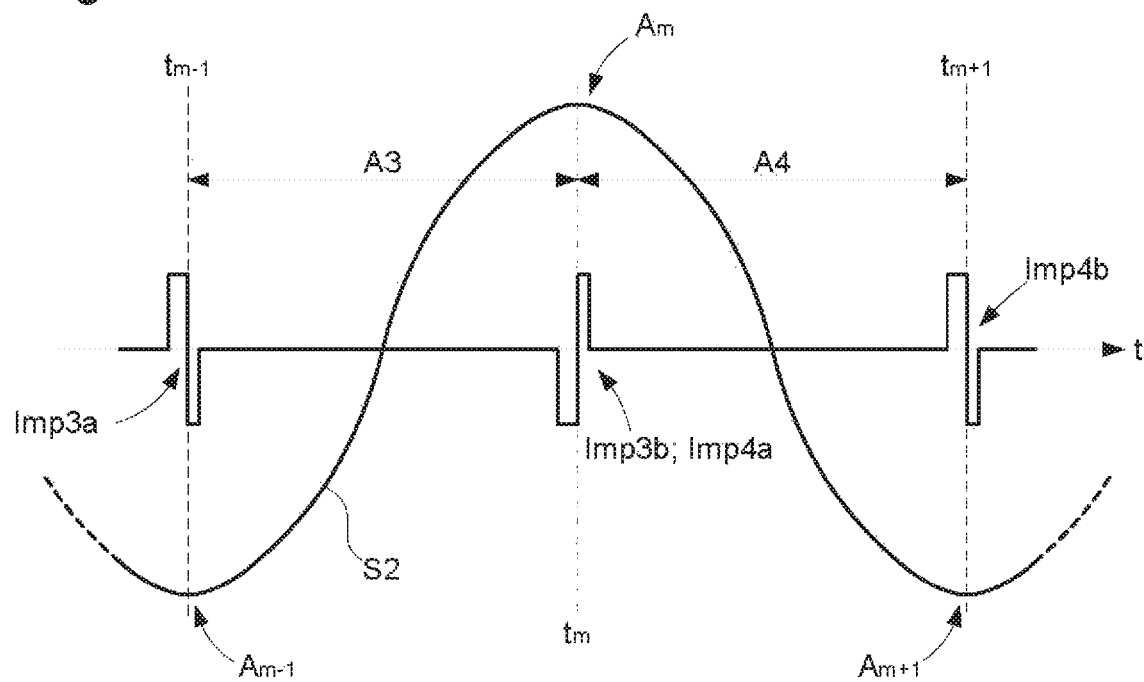
FIG. 15 represents, in the scenario of FIG. 14, an oscillation of the slave mechanical oscillator and the braking pulses in a stable synchronous phase for an alternative embodiment where a braking pulse occurs in each alternation, FIGS. 16 and 17 provide, respectively for the two scenarios of FIGS. 12 and 14, the graph of the angular position of a mechanical oscillator and the corresponding oscillation periods for an operating mode of the correction device where a braking pulse occurs every four oscillation periods.

FIGS. 14 and 15 are similar to FIGS. 12 and 13, but for a scenario where the natural frequency of the oscillator is less than the set-point frequency. Consequently, the pulses Imp3 and Imp4, corresponding to an unstable equilibrium scenario in the correction made by the braking pulses, are respectively situated in the second and the fourth quarter-period (times $t_3$ and $t_4$) where the pulses induce an increase in the oscillation frequency. The explanations will be given in detail again herein as the behaviour of the system stems from the preceding considerations. In the transitory phase (FIG. 14), if a pulse takes place in the alternation A3 to the left of the pulse Imp3 in the zone Z3*a*, the preceding end position $(t_{m-1}, A_{m-1})$ will progressively approach the subsequent pulses. On the other hand, if a pulse takes place to the right of the pulse Imp3 in the zone Z3*b*, the subsequent end position $(t_m, A_m)$ will progressively approach the subsequent pulses. Similarly, if a pulse takes place in the alternation A4 to the left of the pulse Imp4 in the zone Z4*a*, the preceding end position $(t_m, A_m)$ will progressively approach the subsequent pulses. Finally, if a pulse takes place to the right of the pulse Imp4 in the zone Z4*b*, the subsequent end position $(t_{m+1}, A_{m+1})$ will progressively approach the subsequent pulses during the transition phase.

In the synchronous phase (FIG. 15), if a first pulse occurs in the first alternation A3, either the end position $A_{m-1}$ of the oscillation is aligned on the pulses Imp3*a*, or the end position $A_m$ of the oscillation is aligned on the pulses Imp3*b*. In the case of a substantially constant couple, the pulses Imp3*a* and Imp3*b* each have a first part wherein the duration is longer than that of the second part thereof, so as to correct exactly the difference between the natural frequency that is too low of the slave main oscillator and the set-point frequency set by the master auxiliary oscillator. Similarly, in the synchronous phase, if a first pulse occurs in the second alternation A4, either the end position $A_m$ of the oscillation is aligned on the pulses Imp4*a*, or the end position $A_{m+1}$ of the oscillation is aligned on the pulses Imp4*b*. The other considerations made within the scope of the scenario described above with reference to FIGS. 12 and 13 are applied by analogy to the scenario of FIGS. 14 and 15. In conclusion, whether the natural frequency of the free mechanical oscillator is too high or too low and regardless of the time of application of a first braking pulse within an oscillation period, the correction device according to the invention is effective and rapidly synchronises the frequency of the mechanical oscillator, clocking the running of the mechanical movement, on the set-point frequency which is determined by the reference frequency of the master auxiliary oscillator, which controls the braking frequency at which the braking pulses are applied to the resonator of the mechanical oscillator. This remains true if the natural frequency of the mechanical oscillator varies and even if it is, in certain time periods, greater than the set-point frequency, while in other time periods it is less than this set-point frequency.

The teaching given above and the synchronisation obtained by means of the features of the timepiece according to the invention also apply to the scenario where the braking frequency for the application of the braking pulses is not equal to the set-point frequency. In the case of the application of one pulse per oscillation period, the pulses taking place at the unstable positions ($t_1$, Imp1; $t_2$, Imp2; $t_3$, Imp3; $t_4$, Imp4) correspond to corrections to compensate for the time drift during a single oscillation period. On the other hand, if the braking pulses have a sufficient effect to correct a time drift during a plurality of oscillation periods, it is then possible to apply a single pulse per time interval equal to the plurality of oscillation periods. The same behaviour as for the scenario where one pulse is generated per oscillation period will then be observed. Taking the oscillation periods where the pulses occur into consideration, there are the same transitory phases and the same synchronous phases as in the scenario described above. Furthermore, these considerations are also correct if there is a whole number of alternations between each braking pulse. In the case of an odd number of alternations, a transition is made alternatively, depending on the case, from the alternation A1 or A3 to the alternation A2 or A4 in FIGS. 12 to 15. As the effect of two pulses offset by an alternation is identical, it is understood that the synchronisation is carried out as for an even number of alternations between two successive braking pulses. In conclusion, as already stated, the behaviour of the system described with reference to FIGS. 12 to 15 is observed once the braking frequency $F_{FR}$ is equal to $2F0_C/N$, $F0_C$ being the set-point frequency for the oscillation frequency and N a positive whole number.

Though of little interest, it should be noted that the synchronisation is also obtained for a braking frequency $F_{FR}$ greater than double the set-point frequency (2F0), namely for a value equal to N times F0 where N>2. In an alternative embodiment where $F_{FR}$=4F0, there is merely a loss of energy in the system with no effect in the synchronous phase, as one out of every two pulses occurs at the neutral point of the mechanical resonator. For a higher braking frequency $F_{FR}$, the pulses in the synchronous phase which do not occur at the end positions cancel the effects thereof pairwise. It is therefore understood that these are theoretical scenarios with no major practical sense.

Figure 18:
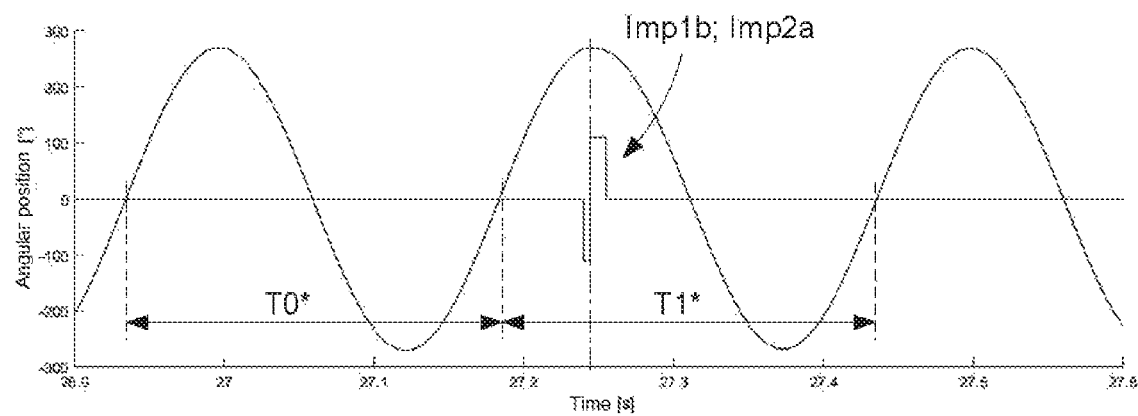
FIGS. 18 and 19 are respectively partial enlargements of FIGS. 16 and 17.
Figure 19:
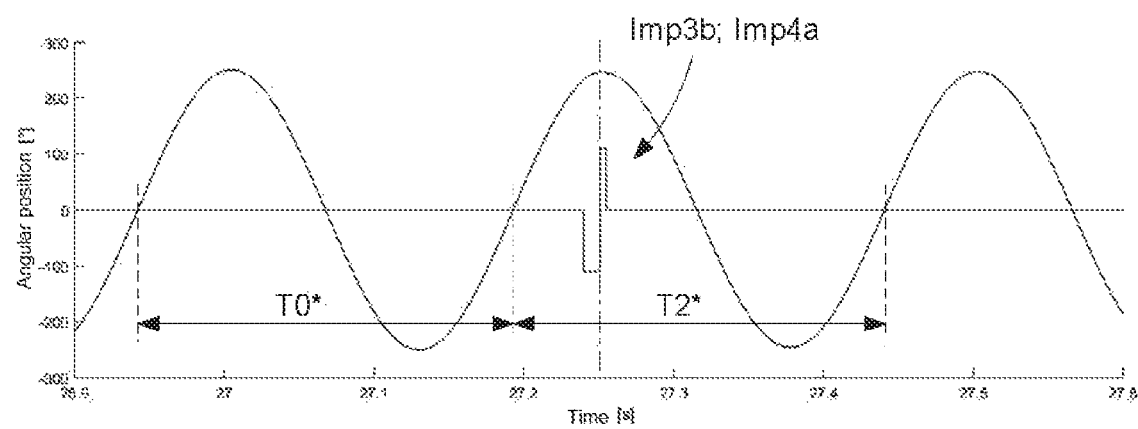
Figure 20:
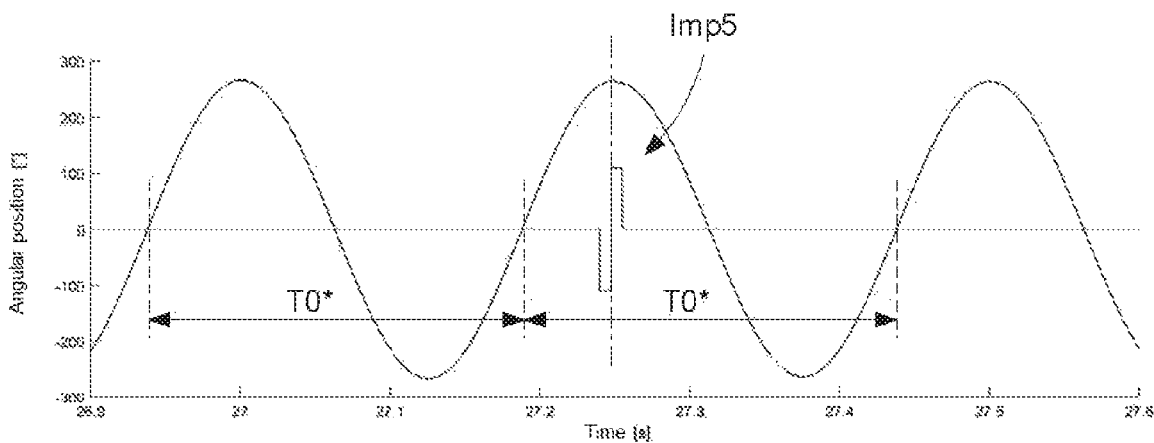
FIG. 20 represents, similarly to the two preceding figures, a specific scenario wherein the frequency of a mechanical oscillator is equal to the braking frequency.

FIGS. 16 and 17 show the synchronous phase for an alternative embodiment with a braking frequency $F_{FR}$ equal to one quarter of the set-point frequency, one braking pulse occurring therefore every four oscillation periods. FIGS. 18 and 19 are partial enlargements respectively of FIGS. 16 and 17. FIG. 16 relates to a scenario where the natural frequency of the main oscillator is greater than the set-point frequency $F0_0$=4 Hz, while FIG. 17 relates to a scenario where the natural frequency of the main oscillator is greater than this set-point frequency. It is observed that only the oscillation periods T1* and T2*, wherein braking pulses Imp1*b* or Imp2*a*, respectively Imp3*b* or Imp4*a* occur, exhibit a variation relative to the natural period T0*. The braking pulses induce a phase shift merely in the corresponding periods. Thus, the instantaneous periods oscillate herein about an average value which is equal to that of the set-point period. It should be noted that, in FIGS. 16 to 19, the instantaneous periods are measured from a passage via zero on a rising edge of the oscillation signal to such a subsequent passage. Thus, the synchronous pulses which occur at the end positions are entirely included in oscillation periods. In order to be comprehensive, FIG. 20 shows the specific scenario where the natural frequency is equal to the set-point frequency. In this case, the oscillation periods T0* all remain equal, the braking pulses Imp5 occurring exactly at end positions of the free oscillation with first and second parts of these pulses which have identical durations (case of a constant braking torque), such that the effect of the first part is cancelled by the opposite effect of the second part.

Figure 21:
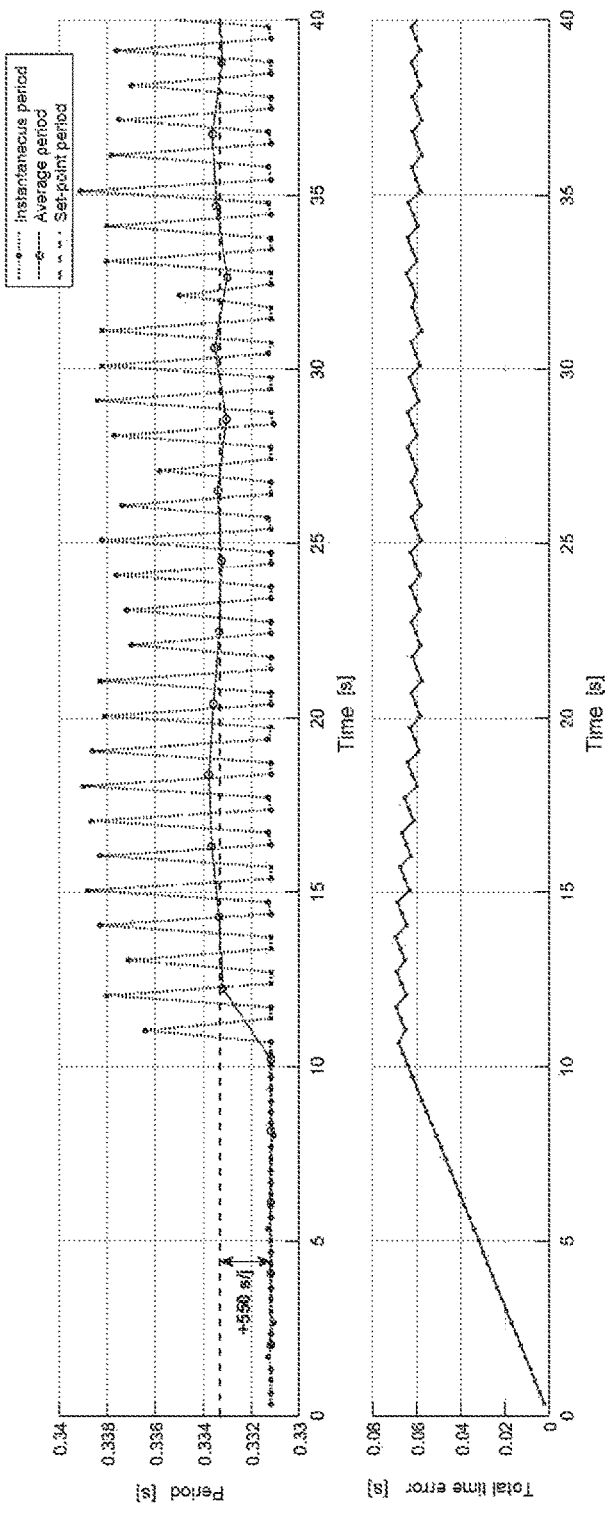
FIG. 21 shows, for an alternative embodiment of a timepiece according to the invention, the progression of the oscillation period of the slave mechanical oscillator as well as the progression of the total time error.

FIG. 21 shows the variation of the oscillation periods for set-point frequency $F0_0=3$ Hz and a suitable braking pulse occurring every three oscillation periods of the mechanical oscillator which times the running of a time indicator mechanism exhibiting a daily error of 550 seconds per day, i.e. about 9 minutes per day. This error is very significant, but the mechanical braking device is configured to be able to correct such an error. The braking effect having to be relatively significant herein, there is a great variation of the instantaneous period but the average period is substantially equal to the set-point period after the engagement of the correction device in the timepiece according to the invention and a short transitory phase. When the correction device is inactive, it is observed, as expected, that the total time error increases linearly as a function of time whereas this error is rapidly stabilised after the engagement of the correction device. Thus, if the time is set after such an engagement of the correction device and the transitory phase, the total error (also referred to as 'cumulative error') remains low, such that the timepiece subsequently indicates a time with a precision corresponding to that of the master oscillator incorporated in this timepiece and associated with the braking device.

Figure 22:
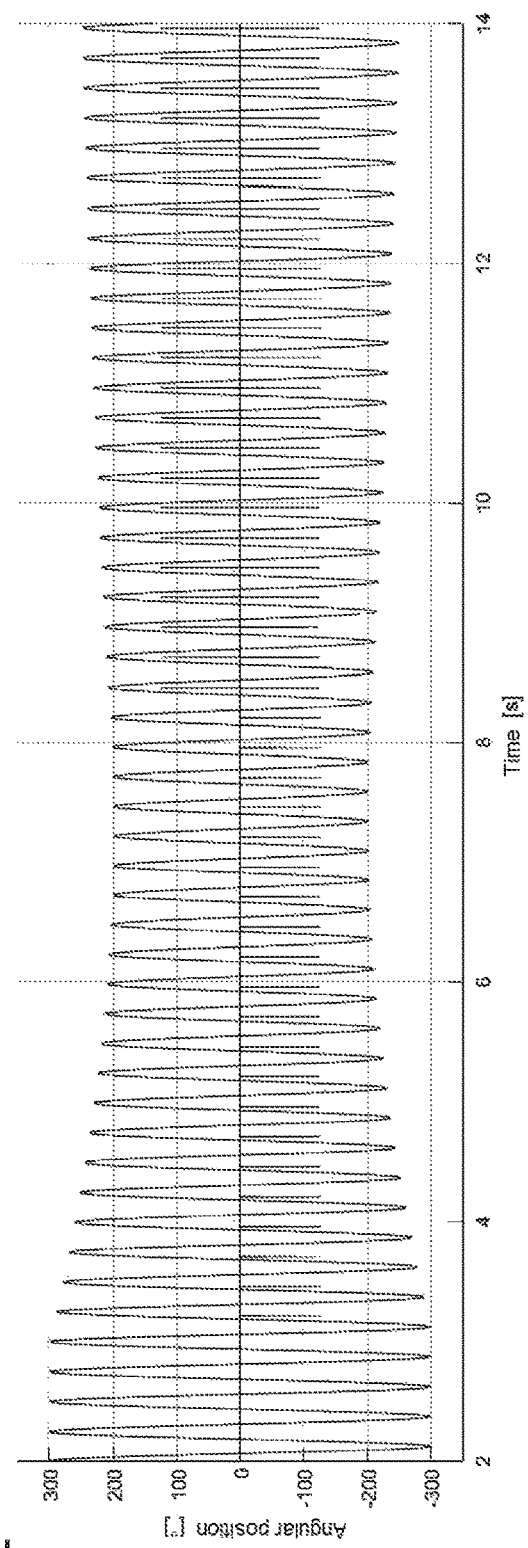
FIG. 22 shows, for a further alternative embodiment of a timepiece according to the invention, the graph of the oscillation of the slave mechanical oscillator in an initial phase following the engagement of the device for correcting a potential time drift.

FIG. 22 shows the progression of the amplitude of the slave mechanical oscillator after the engagement of the correction device according to the invention. In the transitory phase, a relatively pronounced decrease in the amplitude is observed in a scenario where the first pulse takes place close to the zero position (neutral position). The various braking pulses occurring in particular in a first part of this transitory phase induce relatively significant energy losses, as seen in the graph in FIG. 8C. Subsequently, the energy losses decrease relatively rapidly to finally become minimal for a given correction in the synchronous phase. As such, it is observed that the amplitude increases once the pulses include the passage via an end position of the mechanical resonator and continues to increase at the start of the synchronous phase although the dissipated braking energy then stabilises at the minimum thereof, given a relatively great time constant for the amplitude variation of the mechanical oscillator. Thus, the piece according to the invention further has the advantage of stabilising in a synchronous phase for which the energy dissipated by the oscillator, due to the braking pulses selected, is minimal. Indeed, the oscillator exhibits after stabilisation of the amplitude thereof the smallest possible decrease in amplitude for the braking pulses selected. This is an advantage as when the mainspring maintaining the main oscillator is released, the minimal oscillation amplitude to carry out the operation of the mechanical movement is achieved the latest possible while ensuring precise running. The device for correcting the running of a mechanical movement which generates the synchronisation according to the invention therefore has a minimised influence for the power reserve.

To minimise the disturbances generated by the braking frequencies and particularly the energy losses for the timepiece movement, short pulse durations, or even very short pulse durations, will preferably be selected. Thus, in a general alternative embodiment, the braking pulses each have a duration between $\frac{1}{400}$ and $\frac{1}{10}$ of the set-point period. In a preferred alternative embodiment, the braking pulses each have a duration between $\frac{1}{400}$ and $\frac{1}{50}$ of said set-point period. In the latter case, for a set-point frequency equal to 5 Hz, the duration of the pulses is between 0.5 ms and 4 ms.

With reference to FIGS. 1 to 5, timepieces are described with mechanical resonators having a circular braking surface enabling the braking device to apply a mechanical braking pulse to the mechanical resonator substantially at any time of an oscillation period within the usable operating range of the mechanical oscillator formed by the mechanical resonator. This is a preferred alternative embodiment. As timepiece movements generally have balances having a circular felloe with an advantageously continuous outer surface, the preferred alternative embodiment described above may be readily implemented in such movements without requiring modifications of the mechanical oscillator thereof. It is understood that this preferred alternative embodiment makes it possible to minimise the duration of the transition phase and carry out the desired synchronisation within the optimum time.

However, stable synchronisation may already be obtained, after a certain period of time, with a system, formed of the mechanical resonator and the mechanical braking device, which is configured so as to enable the mechanical braking device to start the periodic braking pulses at any position of the mechanical resonator merely in a continuous or quasi-continuous range of positions of this resonator, which is defined, on a first of the two sides of the neutral position of the mechanical resonator, by the range of amplitudes of the mechanical oscillator for the usable operating range thereof. Advantageously, this range of positions is increased, on the side of minimal amplitude, at least by an angular distance corresponding substantially to the duration of a braking pulse, so as to enable for a minimal amplitude a braking pulse by dynamic dry friction. So that the position can act in all the alternations and not merely once per oscillation period, it is then necessary for this system to be configured so as to enable the mechanical braking device to be able also to start the periodic braking pulses at any position of the mechanical resonator of the second of the two sides of said neutral position, within the range of amplitudes of the mechanical oscillator for the usable operating range thereof. Advantageously, the range of positions is also increased, on the side of minimum amplitude, at least by an angular distance corresponding substantially to the duration of a braking pulse.

Thus, in a first general alternative embodiment, the continuous or quasi-continuous range mentioned above of positions of the mechanical resonator extends, on a first of the two sides from the neutral position thereof, at least over the range of amplitudes that the slave mechanical oscillator is liable to have on this first side for a usable operating range of this mechanical oscillator and advantageously further, on the side of minimum amplitude of the range of amplitudes, at least over an angular distance corresponding substantially to the duration of the braking pulses. In a second general alternative embodiment, in addition to the continuous or quasi-continuous range defined hereinabove in the first general alternative embodiment, which is a first continuous or quasi-continuous range, the system mentioned above is configured so as to enable the braking device to be also be able to start the periodic braking pulses at any position of the mechanical resonator, on the second of the two sides from the neutral position thereof, at least in a second continuous or quasi-continuous range of positions of this mechanical resonator extending over the range of amplitudes that the slave mechanical oscillator is suitable to have on this second side for said usable operating range and advantageously further, on the side of minimum amplitude of the range of amplitudes, at least over said first angular distance.

In an enhanced alternative embodiment, the correction device is arranged such that the braking frequency may adopt a plurality of values, preferably a first value in an initial phase of the operation of the correction device and a second value, less than the first value, in a normal operating phase following the initial phase. In particular, the duration of the initial phase will be selected such that the normal operating phase occurs while the synchronous phase has probably already commenced. More generally, the initial phase includes at least the first braking pulses, following the engagement of the correction device, and preferably most of the transitory phase. By increasing the frequency of the braking pulses, the duration of the transitory phase is reduced. Furthermore, this alternative embodiment makes it possible, on one hand, to optimise the braking efficiency during the initial phase to carry out the physical process resulting in synchronisation and, on the other, to minimise the braking energy and therefore the energy losses for the main oscillator during the synchronous phase that remains while the correction device has not been deactivated and the mechanical movement is operating. The first braking pulses may occur in the vicinity of the neutral position of the resonator where the braking effect is lesser on the time phase shift induced for the oscillation of the main oscillator. On the other hand, once the synchronisation has been established, the braking pulses take place in the vicinity of the end positions of this oscillation wherein the braking effect is greatest.

In the synchronous phase, the scenario is therefore robust and maintenance of the synchronisation is already obtained with a relatively low braking frequency. The braking frequency may therefore be reduced in the synchronous phase while maintaining the synchronisation with a satisfactory robustness, particularly in cases of disturbances or shocks liable to be sustained by the timepiece. It should be noted that the braking frequency selected may vary also according to various parameters external to the slave mechanical oscillation which may be measured by suitable sensors, particularly the value of an ambient magnetic field, the temperature in the timepiece or the detection of shocks by an accelerometer.

Finally, within the scope of the present invention, two periodic braking pulse categories may be distinguished relative to the intensity of the mechanical force couple applied to the mechanical resonator and the duration of the periodic braking pulses. As regards the first category, the braking torque and the duration of the braking pulses are selected, for the usable operating range of the mechanical oscillator, so as not to momentarily lock the mechanical resonator during the periodic braking pulses at least in most of the transitory phase described above. In this case, the system is arranged such that the mechanical braking torque is applied to the mechanical resonator, at least in most of any transitory phase, during each braking pulse.

In an advantageous alternative embodiment, the oscillating member and the braking member are arranged such that the periodic braking pulses can be applied, at least in said most of any transitory phase, essentially by dynamic dry friction between the braking member and a braking surface of the oscillating member. As regards the second category, for the usable operating range of the mechanical oscillator and in the synchronous phase described above, the mechanical braking torque and the duration of the periodic braking pulses are selected so as to lock the mechanical resonator during the periodic braking pulses at least in an end part thereof.

In a particular alternative embodiment, there is in the synchronous phase a momentary locking of the mechanical resonator by the periodic braking pulses while, at least in an initial part of any transitory phase where the periodic braking pulses occur outside the end positions of the mechanical resonator, the latter is not locked by these periodic braking pulses.

The invention claimed is:
1. A timepiece that includes a mechanical movement, the timepiece comprising:
  an indicator mechanism configured to indicate a current time;
  a mechanical resonator configured to oscillate along a general oscillation axis about a neutral position corresponding to a minimum potential energy state thereof;
  a maintenance device of the mechanical resonator, the maintenance device and the mechanical resonator forming a mechanical oscillator which is arranged to time a running of the indicator mechanism; and
  a regulation device for regulating a medium frequency of the mechanical oscillator, the regulation device comprising a mechanical braking device of the mechanical resonator, the regulation device being configured to receive, from an auxiliary oscillator, a set-point frequency for said mechanical oscillator;
  wherein the mechanical braking device is configured to apply to said mechanical resonator a dissipative mechanical braking torque during periodic braking pulses which are generated at a braking frequency that is a function of the set-point frequency, said periodic braking pulses each having a duration less than a set-point half-period with the set-point period corresponding to the reciprocal of the set-point frequency, and
  wherein a system formed of the mechanical resonator and the mechanical braking device enables the mechanical braking device to start said periodic braking pulses at any position of the mechanical resonator in a range of positions along said general oscillation axis, said range of positions extending at least on a first side of the two sides from the neutral position of the mechanical resonator over at least a first range of amplitudes that the mechanical resonator is liable to have on the first side for a usable operating range of the mechanical oscillator.
2. The timepiece according to claim 1, wherein said range of positions of the mechanical resonator includes a first part incorporating said first range of amplitudes that the mechanical resonator is liable to have on said first side from the neutral position, said first part being continuous or quasi-continuous and extending from a first minimal amplitude of said first range of amplitudes toward the neutral position, at least over a first angular distance corresponding substantially to the duration of one of said periodic braking pulses ending at the first minimal amplitude for an oscillation of the mechanical resonator having the first minimal amplitude.

3. The timepiece according to claim 1, wherein said system is configured such that said range of positions of the mechanical resonator also extends on the second side of the two sides from the neutral position of the mechanical resonator, over at least a second range of amplitudes that the mechanical resonator is liable to have on the second side for the usable operating range of the mechanical oscillator.

4. The timepiece according to claim 3,
wherein said range of positions of the mechanical resonator includes a first part incorporating said first range of amplitudes that the mechanical resonator is liable to have on said first side from the neutral position, said first part being continuous or quasi-continuous and extending, from a first minimal amplitude of said first range of amplitudes toward the neutral position, at least over a first angular distance corresponding substantially to the duration of one of said periodic braking pulses ending at the first minimal amplitude for an oscillation of the mechanical resonator having the first minimal amplitude; and
wherein said range of positions of the mechanical resonator further includes a second part incorporating said second range of amplitudes that the mechanical resonator is liable to have on said second side from the neutral position, the second part being continuous or quasi-continuous and extending, from a second minimal amplitude of the second range of amplitudes towards said neutral position, at least over a second angular distance corresponding substantially to the duration of one of said periodic braking pulses ending at the second minimal amplitude for an oscillation of the mechanical resonator having the second minimal amplitude.

5. The timepiece according to claim 3, wherein said braking frequency is equal to double said set-point frequency divided by a positive whole number N.

6. The timepiece according to claim 3, further comprising said auxiliary oscillator.

7. The timepiece according to claim 3, wherein the mechanical braking device is arranged to be able to apply to said mechanical resonator said dissipative mechanical braking torque substantially by friction and such that said periodic braking pulses each have essentially a duration less than one quarter of the set-point period.

8. The timepiece according to claim 3, wherein the mechanical braking device is arranged to be able to apply to said mechanical resonator said dissipative mechanical braking torque substantially by friction and arranged such that the periodic braking pulses each have essentially a duration between $1/400$ and $1/10$ of the set-point period corresponding to the reciprocal of the set-point frequency.

9. The timepiece according to claim 3, wherein the mechanical braking device is arranged to be able to apply to said mechanical resonator said dissipative mechanical braking torque substantially by friction and arranged such that the periodic braking pulses each have essentially a duration between $1/400$ and $1/50$ of the set-point period corresponding to the reciprocal of the set-point frequency.

10. The timepiece according to claim 3, wherein said system is configured so as to enable the mechanical braking device to start, in said usable operating range of said mechanical oscillator, one of said periodic braking pulses at any position of the mechanical resonator along said general oscillation axis.

11. The timepiece according to claim 10, wherein the mechanical braking device comprises a braking member which is arranged to be actuated at said braking frequency by the regulation device, so as to apply to an oscillating member of said mechanical resonator said dissipative mechanical braking torque during said periodic braking pulses.

12. The timepiece according to claim 11, wherein said auxiliary oscillator is of the electric type, and
wherein the mechanical braking device is formed by an electromechanical actuator which actuates said braking member, the electromechanical actuator comprising a piezoelectric element or a magneto-resistive element or, to actuate said braking member, an electromagnetic system.

13. The timepiece according to claim 11, wherein said dissipative mechanical braking torque and the duration of the periodic braking pulses are selected, in the usable operating range of said mechanical oscillator, so as not to lock momentarily said mechanical resonator during the periodic braking pulses at least in most of any transitory phase of the operation of the timepiece, said any transitory phase being liable to occur, particularly following an engagement of the regulation device, before a synchronous phase where said mechanical oscillator is synchronised on the periodic braking pulses.

14. The timepiece according to claim 13, wherein the oscillating member and the braking member are arranged such that the periodic braking pulses can be applied, at least said most of said any transitory phase, essentially by dynamic dry friction between the braking member and a braking surface of the oscillating member.

15. The timepiece according to claim 13, wherein, in the usable operating range of the mechanical oscillator and in the synchronous phase of the operation of the timepiece, said dissipative mechanical braking torque and the duration of the periodic braking pulses are selected so as to lock the mechanical resonator momentarily during the periodic braking pulses.

16. The timepiece according to claim 11, wherein said dissipative mechanical braking torque applied to said oscillating member is substantially constant during the periodic braking pulses.

17. The timepiece according to claim 3, wherein said regulation device is arranged such that said braking frequency may adopt successively a plurality of values including a first value in an initial phase of the operation of the regulation device and a second value, less than the first value, in a normal operating phase following the initial phase.

18. The timepiece according to claim 1, wherein the maintenance device includes an escapement.

19. The timepiece according to claim 1, wherein the indicator mechanism includes a gear train actuated by a barrel.

20. The timepiece according to claim 1, wherein the indicator mechanism includes a gear train actuated by a barrel, and wherein the maintenance device includes an escapement comprising a pallet assembly and an escape wheel that is linked with the barrel via the gear train.

* * * * *